US012080358B2

(12) United States Patent
Jung et al.

(10) Patent No.: US 12,080,358 B2
(45) Date of Patent: Sep. 3, 2024

(54) NON-VOLATILE MEMORY DEVICE IMPLEMENTING TEMPERATURE COMPENSATION FEATURES

(71) Applicant: Samsung Electronics Co., Ltd., Suwon-si (KR)

(72) Inventors: Bong-Kil Jung, Seoul (KR); Sang-Wan Nam, Hwaseong-si (KR); Jong Min Baek, Hwaseong-si (KR); Min Ki Jeon, Suwon-si (KR); Woo Chul Jung, Hwaseong-si (KR); Yoon-Hee Choi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 66 days.

(21) Appl. No.: 17/866,904

(22) Filed: Jul. 18, 2022

(65) Prior Publication Data
US 2023/0126012 A1  Apr. 27, 2023

(30) Foreign Application Priority Data

Oct. 22, 2021   (KR) ........................ 10-2021-0141978

(51) Int. Cl.
*G11C 16/34* (2006.01)
*G11C 16/04* (2006.01)
*G11C 16/08* (2006.01)
*G11C 16/24* (2006.01)

(52) U.S. Cl.
CPC ...... *G11C 16/3404* (2013.01); *G11C 16/0483* (2013.01); *G11C 16/08* (2013.01); *G11C 16/24* (2013.01)

(58) Field of Classification Search
CPC . G11C 16/3404; G11C 16/0483; G11C 16/08; G11C 16/24; G11C 16/26; G11C 16/30; G11C 7/04; G11C 16/10; H10B 43/27
See application file for complete search history.

(56) References Cited

U.S. PATENT DOCUMENTS

| | | |
|---|---|---|
| 7,531,998 B2 | 5/2009 | Kim |
| 7,609,195 B2 | 10/2009 | Jeong |
| 7,630,266 B2 | 12/2009 | Incarnati et al. |
| 8,334,796 B2 | 12/2012 | Wani et al. |

(Continued)

OTHER PUBLICATIONS

European Search Report issued Dec. 9, 2022 in European Application No. 22183266.0.

(Continued)

*Primary Examiner* — Ajay Ojha
(74) *Attorney, Agent, or Firm* — Harness, Dickey & Pierce, P.L.C.

(57) ABSTRACT

A nonvolatile memory device including a memory cell array, a first voltage generator configured to generate a word line operating voltage for each word line of the memory cell array, a second voltage generator configured to generate a bit line operating voltage of the memory cell array, and a temperature unit configured to determine, from a temperature range table, a temperature range for a temperature code according to a real-time temperature of the memory cell array, and to adjust a power supply voltage of the first or second voltage generator based on a selection signal mapped to the determined temperature range.

20 Claims, 11 Drawing Sheets

(56) References Cited

U.S. PATENT DOCUMENTS

| | | |
|---|---|---|
| 9,874,886 B2 | 1/2018 | Kim |
| 11,009,407 B2 | 5/2021 | Ikeda et al. |
| 11,145,373 B1 | 10/2021 | Lee et al. |
| 2010/0002747 A1 | 1/2010 | Bosch et al. |
| 2010/0097858 A1* | 4/2010 | Tokiwa .................. H10B 43/20 365/185.05 |
| 2010/0110815 A1 | 5/2010 | Lee et al. |
| 2014/0140130 A1 | 5/2014 | Song et al. |
| 2019/0115077 A1 | 4/2019 | Shin et al. |
| 2021/0241833 A1* | 8/2021 | Takizawa ................ G11C 16/30 |
| 2021/0396604 A1* | 12/2021 | Nittala ................. G01K 15/005 |
| 2023/0004310 A1* | 1/2023 | Kondo ................... G06F 3/0659 |

OTHER PUBLICATIONS

Examination issued Jan. 4, 2023 in European Application No. 22183266.0.

* cited by examiner

Ideal

Real

| TEMP code | Sel | Coefficient | Y-intercept |
|---|---|---|---|
| 0x00 ≤ code < k1 | 1 | A | a |
| k1 ≤ code < k2 | 2 | B | b |
| k2 ≤ code < k3 | 3 | C | c |
| k3 ≤ code < 0xFF | 4 | D | d |

| wordline | SSL1 | SSL2 | SSL3 | SSL4 |
|---|---|---|---|---|
|  | off | on | off | off |
| WL12 | $V_{READ}$ | | | |
| WL11 | $V_{PASS}$ | | | |
| WL10 | $V_{PASS}$ | | | |
| WL9 | $V_{PASS}$ | | | |
| WL8 | $V_{PASS}$ | | | |
| WL7 | $V_{PASS}$ | | | |
| WL6 | $V_{PASS}$ | | | |
| WL5 (B_WLs) | $0 \rightarrow V_{READ}$ | | | |
| WL4 (B_WLs) | $0 \rightarrow V_{READ}$ | | | |
| WL3 | $V_{CON1}$ | | | |
| WL2 | $V_{CON2}$ | | | |
| WL1 | $V_{PASS}$ | | | |
|  | GSL1 | GSL2 | GSL3 | GSL4 |
|  | off | on | off | off |

NON-VOLATILE MEMORY DEVICE IMPLEMENTING TEMPERATURE COMPENSATION FEATURES

CROSS-REFERENCE TO RELATED APPLICATION

This application claims priority from Korean Patent Application No. 10-2021-0141978 filed on Oct. 22, 2021 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a memory device, and more particularly, to a nonvolatile memory device that performs temperature compensation according to a temperature state of the memory device.

2. Description of the Related Art

Semiconductor memory devices are memory devices using a semiconductor such as silicon (Si), germanium (Ge), gallium arsenide (GaAs), indium phosphide (InP), and/or the like. Semiconductor memory devices may be largely classified into volatile memory devices or nonvolatile memory devices.

The nonvolatile memory device is a memory device which can retain data even when the supply of power is interrupted. Examples of nonvolatile memory devices include read-only memory (ROM), programmable ROM, electrically programmable ROM (EPROM), electrically erasable programmable ROM (EEPROM), flash memory device, phase-change random-access memory (PRAM), magnetoresistive random-access memory (MRAM), resistive random-access memory (RRAM), ferroelectric random-access memory (FRAM), and the like. The flash memory device may be broadly classified into NOR flash memory and NAND flash memory.

The nonvolatile memory device may be included in, for example, an MP3 player, a digital camera, a smartphone, a camcorder, a flash card, a solid state disk (SSD), and/or the like. During operation of the nonvolatile memory device, a bit line operating voltage and a word line operating voltage are generated to control a memory cell. In these cases, if the bit line operating voltage and the word line operating voltage are not adjusted according to the temperature, an error may occur in data sensed by the memory cell.

SUMMARY

Aspects of the present disclosure provide a nonvolatile memory device with improved operating performance by adaptively compensating an operating voltage for each operating temperature range, and an operating method thereof.

Aspects of the present disclosure provide a nonvolatile memory device that provides more reliable data by varying compensation for each temperature range while using a digital temperature sensor, and an operating method thereof.

However, aspects of the present disclosure are not restricted to those described herein. The above and other aspects of the present disclosure will become more apparent to one of ordinary skill in the art to which the present disclosure pertains by referencing the detailed description of the present disclosure given below.

According to an aspect of the present disclosure, there is provided a nonvolatile memory device including: a memory cell array including a plurality of memory cells; an address decoder configured to decode a row address and a column address from an address signal; a first voltage generator configured to generate a word line operating voltage for each word line of the memory cell array according to the decoded row address; a second voltage generator configured to generate a bit line operating voltage of the memory cell array according to the decoded column address; a page buffer circuit configured to activate according to the bit line operating voltage and to store data to be stored in or read from at least one memory cell; and a temperature unit configured to determine, from a temperature range table storing a plurality of selection signals mapped to each of a plurality of temperatures ranges, a temperature range for a temperature code according to a real-time temperature of the memory cell array, and to adjust a power supply voltage of at least one of the first or second voltage generator based on a selection signal mapped to the determined temperature range.

According to another aspect of the present disclosure, there is provided a nonvolatile memory device including: a cell area including a memory cell array including a plurality of memory cells on a first substrate; and a peripheral circuit area on a second substrate including a plurality of circuit devices and a temperature unit, the plurality of circuit elements configured to access the memory cell array and the temperature unit configured to sense a real-time temperature of the memory cell array and to determine a temperature range, from among a plurality of temperature ranges, for the sensed real-time temperature and to adjust an operating voltage to be applied to the memory cell array based on a compensation value mapped to the determined temperature range.

According to yet another aspect of the present disclosure, there is provided a nonvolatile memory device including: a memory cell array including a plurality of memory cells; a digital temperature sensor below the memory cell array and configured to measure a real-time temperature of the memory cell array and to output a temperature code according to the real-time temperature; a first address decoder and voltage generator connected to at least one word line of the memory cell array and configured to apply a word line operating voltage to the at least one word line according to a decoded word line address; a second address decoder and voltage generator connected to at least one bit line of the memory cell array and configured to apply a bit line operating voltage to the at least one bit line according to a decoded bit line address; a plurality of page buffer circuits connected to the at least one bit line of the memory cell array and configured to transmit data to a memory cell that corresponds to the decoded word line address and the decode bit line address and/or to receive stored data; and a temperature unit configured to control at least one of the word line operating voltage or the bit line operating voltage such that at least one of a voltage level of the word line operating voltage or a voltage level of the bit line operating voltage is adjusted based on a compensation value selected according to a temperature range, from among a plurality of temperature ranges, for the temperature code.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail some example embodiments thereof with reference to the attached drawings, in which.

DETAILED DESCRIPTION OF THE EMBODIMENTS

Figure 1:
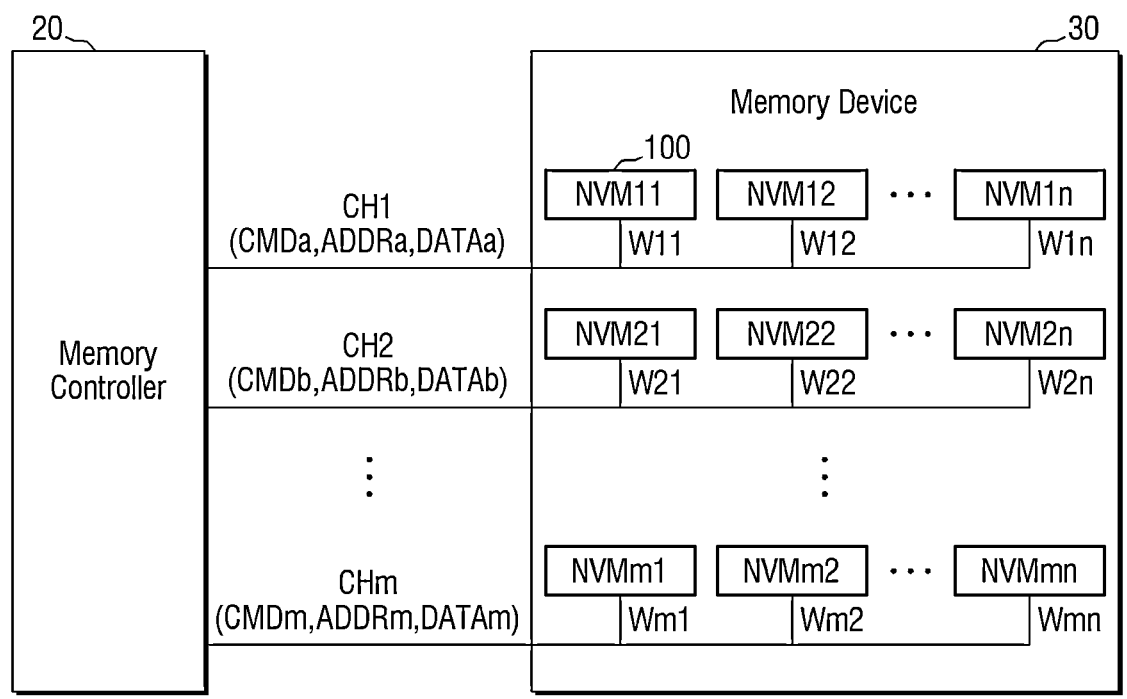
FIG. 1 is a block diagram illustrating a memory system according to some example embodiments of the present disclosure.

Hereinafter, a memory device according to some example embodiments of the present disclosure will be described with reference to FIGS. 1 to 15. Unless otherwise noted, like reference characters denote like elements throughout the attached drawings and written description, and thus descriptions will not be repeated.

The functional blocks described this disclosure may denote elements that process (and/or perform) at least one function or operation and, unless indicated otherwise, may be included in (and/or implemented as) processing circuitry such hardware, software, or a combination of hardware and software. For example, the processing circuitry more specifically may include (and/or be included in), but is not limited to, a processor (and/or processors), Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Although terms like "first," "second," "third," etc., may be used herein to describe various elements, components, regions, layers, and/or sections, these terms are only used to distinguish one element, component, region, layer, or section, from another region, layer, or section. Thus, these elements, components, regions, layers, and/or sections should not be otherwise limited by these terms. Therefore, a first element, component, region, layer, or section, discussed below may be termed a second element, component, region, layer, or section, without departing from the scope of this disclosure.

FIG. 1 is a block diagram illustrating a memory system according to some example embodiments of the present disclosure. Referring to FIG. 1, a memory system 10 may include a memory device 30 and a memory controller 20. The memory system 10 may support a plurality of channels CH1 to CHm, and the memory device 30 and the memory controller 20 may be connected through the plurality of channels CH1 to CHm. For example, the memory system 10 may be implemented as a storage device of an electronic device, a storage device (such as a universal flash storage (UFS) and/or a solid state drive (SSD)), a storage device included in a data center, and/or the like.

The memory device 30 may include a plurality of nonvolatile memory devices 100 (e.g., NVM11 to NVMmn). Each of the nonvolatile memory devices 100 (e.g., NVM11 to NVMmn) may be connected to one of the plurality of channels CH1 to CHm through a corresponding way. For example, the nonvolatile memory devices NVM11 to NVM1n may be connected to the first channel CH1 through the ways W11 to W1n, and the nonvolatile memory devices NVM21 to NVM2n may be connected to the second channel CH2 through the ways W21 to W2n. In some example embodiments, each of the nonvolatile memory devices NVM11 to NVMmn may be implemented in the form of an arbitrary memory unit capable of operating according to an individual command from the memory controller 20. For example, each of the nonvolatile memory devices NVM11 to NVMmn may be implemented as a chip or a die, but the present disclosure is not limited thereto.

The memory controller 20 may transmit and receive signals to and from the memory device 30 through the plurality of channels CH1 to CHm. For example, the memory controller 20 may transmit commands CMDa to CMDm, addresses ADDRa to ADDRm, and data DATAa to DATAm to the memory device 30, and/or receive the data DATAa to DATAm from the memory device 30, through the channels CH1 to CHm.

Through each of the channels CH1 to CHm, the memory controller 20 may select one of the nonvolatile memory devices 100 connected to the corresponding channel CH1 to CHm and transmit and receive signals to and from the selected nonvolatile memory device. For example, as illustrated in FIG. 1, the memory controller 20 may select nonvolatile memory device NVM11 from among the nonvolatile memory devices NVM11 to NVM1n connected to the first channel CH1. The memory controller 20 may transmit a command CMDa, an address ADDRa, and data DATAa to the selected nonvolatile memory device NVM11, and/receive data DATAa from the selected nonvolatile memory device NVM11, through the first channel CH1.

The memory controller 20 may transmit and receive signals to and from the memory device 30 in parallel through different channels. For example, the memory controller 20 may transmit a command CMDb to the memory devices NVM21 to NVM2n through the second channel CH2 while transmitting a command CMDa to the memory devices NVM11 to NVM1n through the first channel CH1. For example, the memory controller 20 may receive data DATAb from the memory devices NVM21 to NVM2n through the second channel CH2 while receiving data DATAa from the memory devices NVM11 to NVM1n through the first channel CH1.

The memory controller 20 may control the overall operation of the memory device 30. The memory controller 20 may transmit signals to the channels CH1 to CHm to control each of the nonvolatile memory devices 100 (e.g., NVM11 to NVMmn) connected to the channels CH1 to CHm. For example, the memory controller 20 may transmit the command CMDa and the address ADDRa to the first channel CH1 to control a selected one of the nonvolatile memory devices 100 (e.g., a selected one of NVM11 to NVM1n).

Each of the nonvolatile memory devices 100 (e.g., NVM11 to NVMmn) may operate under the control of the memory controller 20. For example, the nonvolatile memory device NVM11 may program the data DATAa according to the command CMDa, the address ADDRa, and the data DATAa provided to the first channel CH1. For example, the nonvolatile memory device NVM21 may read the data DATAb according to the command CMDb and the address ADDRb provided to the second channel CH2, and may transmit the read data DATAb to the memory controller 20.

Although it is illustrated in FIG. 1 that the memory device 30 communicates with the memory controller 20 through m channels, and that the memory device 30 includes n nonvolatile memory devices 100 corresponding to each channel CH, the present disclosure is not limited thereto, and the number of channels and the number of nonvolatile memory devices connected to one channel may vary.

Figure 2:
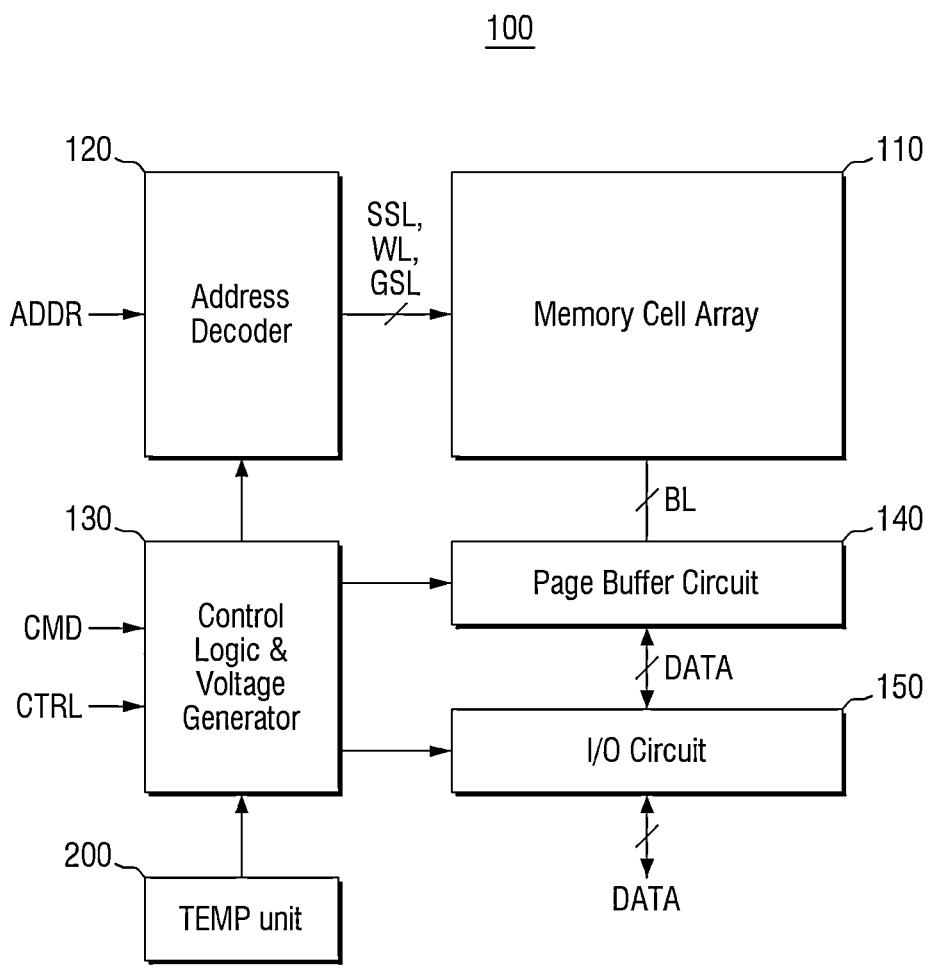
FIG. 2 is a block diagram illustrating a nonvolatile memory device according to some example embodiments of the present disclosure.

FIG. 2 is a block diagram illustrating a nonvolatile memory device according to some example embodiments of the present disclosure. Referring to FIG. 2, a nonvolatile memory device 100 may include a memory cell array 110, an address decoder 120, a control logic and voltage generator 130, a page buffer circuit 140, an input/output circuit 150, and a temperature unit 200.

The memory cell array 110 may include a plurality of memory blocks. Each memory block may include memory cells forming, e.g., a two-dimensional structure (e.g., an array) and/or a three-dimensional structure (e.g., a stack). For example, memory cells of each memory block may also be stacked in a direction perpendicular to a substrate to form a three-dimensional structure. Each memory block may include a plurality of cell strings, and each cell string may include a plurality of memory cells. The plurality of memory cells may be connected to a plurality of word lines WL. Each memory cell may be provided as a single level cell (SLC) storing 1 bit and/or a multi level cell (MLC) storing at least 2 bits.

In some example embodiments, the address decoder 120 may be connected to the memory cell array 110 through the plurality of word lines WL, a string select line SSL, and a ground select line GSL. In some example embodiments, e.g., when the memory cell array 110 is formed in a three-dimensional structure, the address decoder 120 may be connected to the memory cell array 110 through a plurality of word lines WL, a plurality of string select lines SSL, and a plurality of ground select lines GSL. The address decoder 120 may receive an address ADDR from an external device (e.g., a memory controller, a host, an AP, etc.), and may decode the received address ADDR to select at least one word line from among the plurality of word lines WL. The address decoder 120 may control voltages of the plurality of word lines WL to perform a read and/or write operation on the selected word line. In some example embodiments, the address decoder 120 may decode a column address of the received address and transfer the decoded column address to the page buffer circuit 140. The page buffer circuit 140 may control the bit line BL based on the received column address.

The control logic and voltage generator 130 may receive a command CMD and a control signal CTRL from an external device, and may control the address decoder 120, the page buffer circuit 140, and the input/output circuit 150 in response to the received signals. For example, the control logic and voltage generator 130 may control the address decoder 120, the page buffer circuit 140, and the input/output circuit 150 in response to the command CMD and the control signal CTRL such that data DATA is written to the memory cell array 110. Alternatively, the control logic and voltage generator 130 may control the address decoder 120, the page buffer circuit 140, and/or the input/output circuit 150 in response to the command CMD and the control signal CTRL such that data DATA stored in the memory cell array 110 is output. Alternatively, the control logic and voltage generator 130 may control the address decoder 120, the page buffer circuit 140, and the input/output circuit 150 in response to the command CMD and the control signal CTRL such that a part of the memory cell array 110 is deleted.

The control logic and voltage generator 130 may generate various voltages used in the operation of the nonvolatile memory device 100. For example, the control logic and voltage generator 130 may generate a plurality of read voltages, a plurality of verify voltages, a plurality of program voltages, a plurality of pass voltages, a plurality of erase voltages, and so on, and may provide the generated voltages to the address decoder 120.

According to some embodiments, the voltage generator 130 may be (and/or include) a plurality of voltage generators including a word line operating voltage generator for the word line operation of the memory cell array, a bit line operating voltage generator for the bit line operation, and a voltage generator for generating operating voltages for other components included in the nonvolatile memory device 100. The bit line operating voltage generator may apply a different operating voltage to each of the page buffer circuits 140 of a selected column and an unselected column, respectively, according to the decoded column address. The word line operating voltage generator may apply a different word line operating voltage to each of the selected word line, adjacent word lines of the selected word line, and unselected non-adjacent word lines according to a decoded row address.

The temperature unit 200 may measure the temperature state of the nonvolatile memory device 100 in real time, and the control logic and voltage generator 130 may be controlled based on the measured temperature (e.g., to control the operating voltage of the memory device 100). According to some embodiments, a read voltage when the nonvolatile memory device 100 is at a hot temperature and a read voltage when the nonvolatile memory device 100 is at a cold temperature may be adjusted to be different from each other. For example, by controlling the voltage generator 130, a voltage level of a signal supplied to the page buffer circuit 140 may be adjusted according to the temperature. For example, by controlling the voltage generator 130, a voltage level of a signal supplied to the address decoder 120 may be adjusted according to the temperature. Further details will be described with reference to FIG. 3.

The page buffer circuit 140 may be connected to the memory cell array 110 through a plurality of bit lines BL. The page buffer circuit 140 may buffer signals transmitted to and/or from the memory cell array 110. For example, the page buffer circuit 140 may temporarily store data DATA read from the memory cell array 110 and/or temporarily store data DATA to be written to the memory cell array 110.

The input/output circuit 150 may receive data DATA from an external device and transfer the received data DATA to the page buffer circuit 140 under the control of the control logic and voltage generator 130. The input/output circuit 150 may also transfer data DATA received from the page buffer circuit 140 to an external device under the control of the control logic and voltage generator 130.

For example, during a program operation of the nonvolatile memory device 100, data DATA to be programmed to the memory cell array 110 may be temporarily stored in the page buffer circuit 140. The nonvolatile memory device 100 may program the data DATA stored in the page buffer circuit 140 to the memory cell array 110 by performing a plurality of program loops. Each of the plurality of program loops may include a program step for applying a program pulse and/or a verify step for applying a verify voltage.

Figure 3:
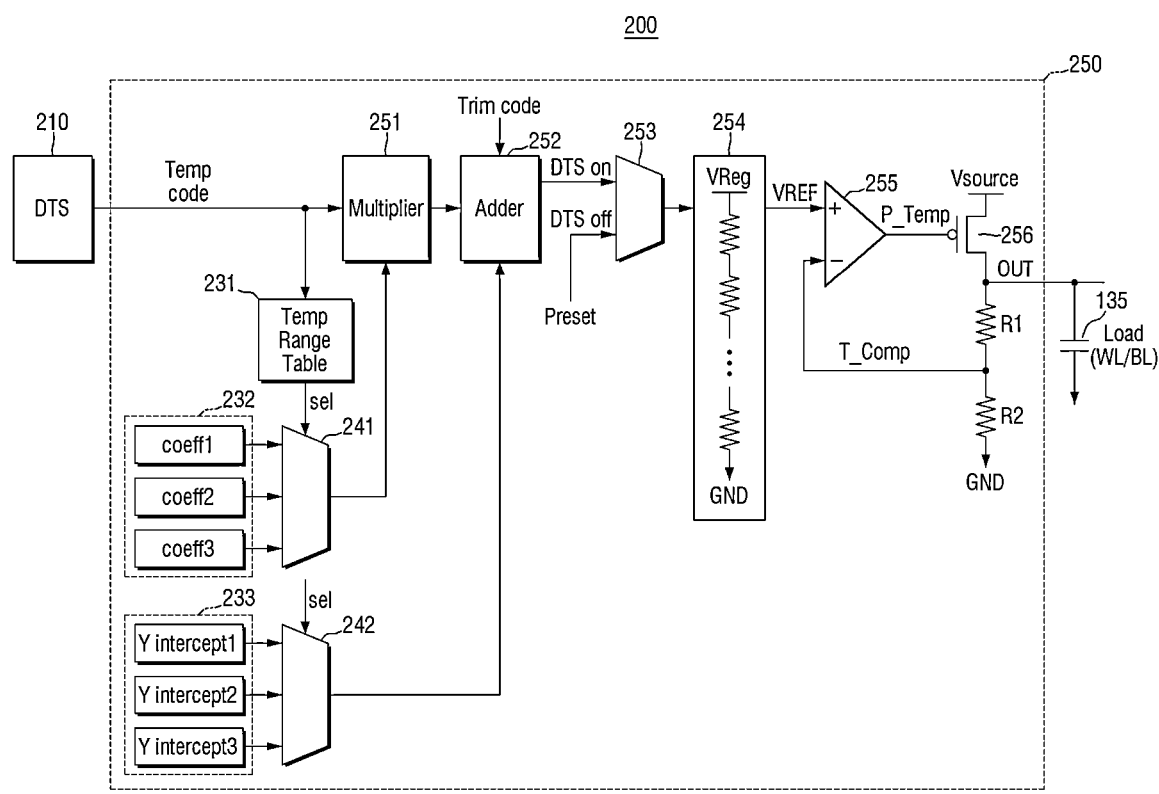
FIG. 3 is a block diagram illustrating in more detail an example temperature unit of FIG. 2.
Figure 4A:
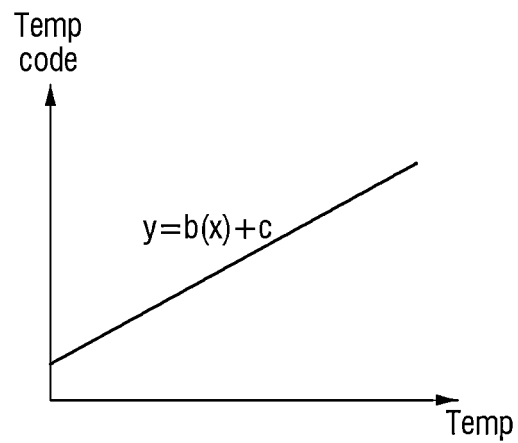
FIGS. 4A and 4B show graphs for explaining an operation of a temperature unit according to some example embodiments.
Figure 4B:
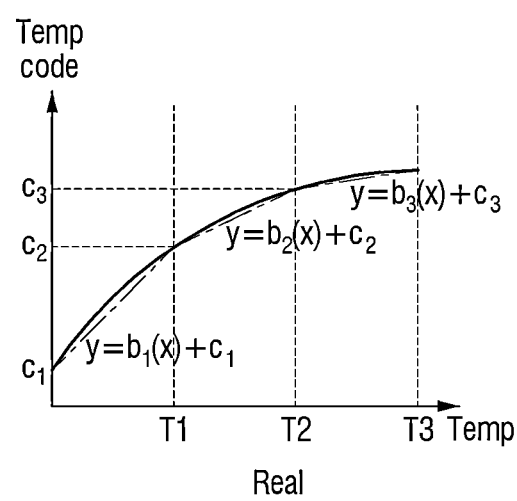
Figures 5, 6:
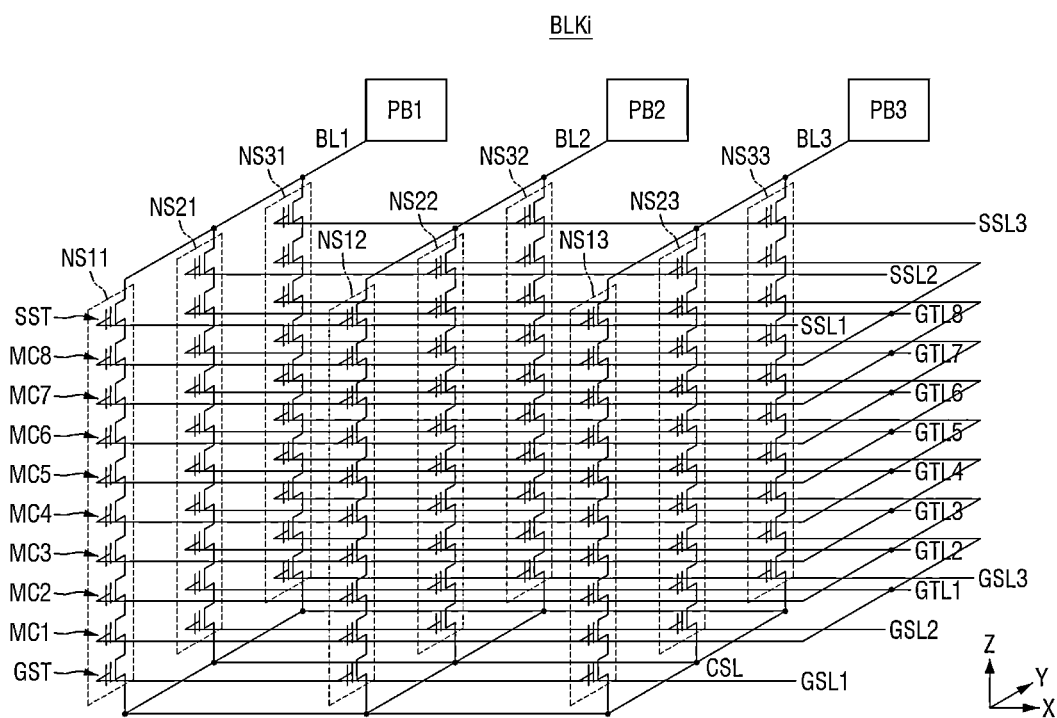
FIG. 5 is a temperature range table according to some example embodiments.
FIG. 6 is a diagram for explaining a three-dimensional V-NAND structure applicable to a nonvolatile memory device according to some example embodiments.

FIG. 3 is a block diagram illustrating in more detail an example temperature unit 200 of FIG. 2. FIGS. 4A and 4B show graphs for explaining an operation of a temperature unit according to some example embodiments. FIG. 5 is a temperature range table according to some example embodiments.

Referring to FIG. 3, according to some embodiments, the temperature unit 200 may include a temperature sensor 210, temperature range determiners 231, 232, 233, 241, and 242, a multiplier 251, an adder 252, a multiplexer MUX3 253, a resistor selector 254, a comparator 255, and a temperature compensation transistor 256.

In some example embodiments, the temperature sensor 210 may be a digital temperature sensor (DTS). A digital temperature sensor may, for example, possess better current characteristics and linearity than an analogous analog temperature sensor. The temperature sensor 210 may be disposed in a peripheral circuit area of the nonvolatile memory device 100 to measure in real time a temperature state according to an operation of the nonvolatile memory device 100. The temperature sensor 210 may output a temperature code TEMP code based on the measured temperature. According to some embodiments, each time the temperature changes by a predetermined (and/or otherwise determined) value, the temperature code may change by 1. For example, in some embodiments if the temperature consistently changes by, e.g., 1° C., the temperature code may also constantly and/or consistently change.

According to some embodiments, the temperature sensor 210 may sense a temperature state at least twice to increase accuracy and output a temperature code based on an average value of the sensed temperatures. Alternatively, according to some embodiments, the temperature sensor 210 may eliminate the variation associated with a location on the basis of pre-stored location information of a memory cell (e.g., a die on which the memory cell is disposed, the location of the die, and so on) and may output the temperature code.

The temperature range table 231 includes a plurality of temperature ranges. The temperature code TEMP code output from the temperature sensor 210 may be compared to the plurality of temperature ranges, and a temperature range which the temperature code TEMP code falls in may be selected and/or determined, and the range for the temperature code TEMP code is selected, accordingly.

Referring to FIGS. 4A and 4B, in an ideal case, the temperature sensor 210 possesses linearity (e.g., $y=b(x)+c$) having a constant slope as seen in ideal the temperature-temperature code graph. Although not illustrated, operating voltage ranges for the word line operating voltage and the bit line operating voltage differ from each other, and thus the word line operating voltage and the bit line operating voltage may have different slope and intercept values in the temperature-temperature code relationship.

However, due to other environmental factors, the temperature code may not have a constant linearity, but may have a nonlinearity with a slope that varies depending on the temperature range. For example, when the temperature range is 0 to T1, the temperature code may approximate a linearity of $y=b_1(x)+c_1$, when the temperature range is T1 to T2, the temperature code may approximate a linearity of $y=b_2(x)+c_2$, and/or when the temperature range is T2 to T3, the temperature code may approximate a linearity of $y=b_3(x)+c_3$. In these cases, the coefficients $b_1$, $b_2$, and $b_3$ may have different values, and intercepts $c_1$, $c_2$, and $c_3$ may also have different values.

Therefore, an analog level of an operating voltage for accessing the memory cell needs to be controlled in a different manner depending on the temperature range in order to reduce an error. For example, the amount of cell current flowing at a cold temperature is small compared with that at a hot temperature. To compensate for this, the analog level of the memory cell operating voltage at a cold temperature should be raised compared to that at a hot temperature, and/or the degree of compensation should be increased as the temperature lowers.

Referring to FIG. 5, according to some embodiments, the temperature sensor 210 outputs a real-time temperature state of the nonvolatile memory device 100 as temperature code TEMP code. For example, the temperature range may be divided into a plurality (e.g., four) ranges and the temperature code TEMP code may be a $2^n$-bit (e.g., 8-bit) code. In the following description, the temperature range is divided into four ranges and the temperature code TEMP code is an 8-bit code, however the present disclosure is not limited thereto and the number of ranges and/or bits may be more (or less) than described. A selection signal Sel, a coefficient value, and a y-intercept value, which correspond to the temperature code TEMP code output from the temperature sensor 210 on the basis of boundary values (e.g., k1, k2, k3, and so on) of each temperature range, may be mapped and stored in the temperature range table 231. For example, when the temperature code is a number greater than the boundary value k2 and smaller than k3 (k2<temp code<k3), the temperature range table 231 outputs selection signal Sel=3, and selects and outputs a coefficient value (coefficient=C) and an intercept value (Y-intercept=c) through the multiplexer MUX1 of FIG. 3. In some embodiments the boundary values (e.g., k1, k2, k3, and so on) may be preset and/or otherwise determined and/or adjusted.

According to some embodiments, the temperature range table 231 may include only a mapping table for temperature ranges TEMP code based on a boundary value and a selection signal Sel. Alternatively, according to some embodiments, as shown in FIG. 5, temperature ranges TEMP code, a selection signal Sel corresponding to each temperature range, a plurality of coefficients, and a plurality of intercepts may be mapped and stored, respectively.

According to some embodiments, the plurality of coefficients and the plurality of intercepts stored may be a plurality of bit line coefficients and a plurality of bit line intercepts associated with a bit line operation for each of the plurality of temperature ranges. Alternatively, according to some embodiments, the plurality of coefficient and the plurality of intercepts stored may be a plurality of word line coefficients and a plurality of word line intercepts associated with a word line operation for each of the plurality of temperature ranges.

According to some embodiments, when the temperature range table 231 includes only a mapping table for the temperature ranges TEMP code based on boundary values and selection signals Sel, the temperature unit 200 may further include a coefficient selector 241 and an intercept selector 242. The coefficient selector 241 may be connected to a memory 232 including a plurality of coefficients respectively corresponding to the selection signals Sel, and may output any one coefficient based on the selection signal Sel. The intercept selector 242 may be connected to a memory 233 including a plurality of Y-intercepts respectively corresponding to the selection signals Sel, and may output any one intercept based on the selection signal Sel.

The multiplier 251 multiplies the temperature code TEMP code output from the temperature sensor 210 and the selected coefficient and outputs the multiplied result. The adder 252 adds the selected intercept to the multiplied value output from the multiplier 251 and outputs the added value. When the temperature sensor 210 is activated to operate, the multiplexer 253 selects and outputs the output value of the adder 252 (denoted as "DTS on" in FIG. 3), and when the temperature sensor 210 is deactivated, selects and outputs a preset (and/or otherwise set) value Preset (denoted as "DTS off" in FIG. 3).

The resistor selector 254 outputs a compensation level obtained by applying a predetermined (and/or otherwise determined) resistance component to the output value of the multiplexer 253. For example, the resistor selector 254 may be a voltage divider in which a plurality of resistors are connected in series between a register voltage terminal and a ground terminal. The resistor selector 254 may output a reference voltage VREF obtained by dividing the output signal of the multiplexer 253 by a predetermined (and/or otherwise determined) ratio. The comparator 255 compares the current reference voltage VREF output from the resistor selector 254 and a previous compensation level T_Comp and outputs a current compensation level P_Temp. The temperature compensation transistor 256, which may be a P-type transistor connected to a source voltage Vsource, is gated to the current compensation level P_Temp and outputs an output signal OUT, and the previous compensation level (temperature compensation level) for the next section is generated based on the output signal OUT. For example, the previous compensation level T_Comp may have a value in which a resistance ratio based on resistors R1 and R2 with respect to the output signal OUT is considered. In this case, the output signal OUT will be described with reference to FIGS. 9 and 12 below.

Therefore, in order to improve performance of a memory device due to the nonlinearity according to temperature, when temperature compensation is performed for an operating voltage applied to each word line and each bit line, the entire temperature range measurable during the operation of the nonvolatile memory device 100 may be divided into a plurality of temperature ranges and linearity corresponding to each temperature range may be set. For example, as the temperature range table 231 includes coefficient/intercept values corresponding to each temperature range, data reliability and integrity of the nonvolatile memory device 100 may be further improved when a temperature compensation value is obtained.

According to some embodiments, the temperature range table 231 may store a plurality of coefficients and a plurality of intercepts corresponding to each of a plurality of temperature ranges, and according to some embodiments, the plurality of coefficients and the plurality of intercepts may be a plurality of bit line coefficients and a plurality of bit line intercepts associated with a bit line operation for each of the plurality of temperature ranges. Alternatively, according to some embodiments, a plurality of coefficients and a plurality of intercepts stored may be a plurality of word line coefficients and a plurality of word line intercepts associated with a word line operation for each of the plurality of temperature ranges.

Alternatively, according to some embodiments, the temperature range table 231 may set and/or preset a plurality of temperature ranges according to the trend line (e.g., linearity or, even when nonlinear, linearity at each temperature range) of the temperature-temperature code graph of FIGS. 4A and 4B, and store a plurality of selection signals corresponding to each temperature range. In these cases, the temperature unit 200 may include memories 232 and 233 that store a plurality of coefficients and a plurality of intercepts, respectively, a coefficient selector 241, and an intercept selector 242. According to the selection signal Sel output from the temperature range table 231, the coefficient selector 241 may output any one coefficient from the memory 232 and the intercept selector 242 may output any one intercept from the memory 233. According to some example embodiments, the plurality of coefficients and the plurality of intercepts may be a plurality of bit line coefficients and a plurality of bit line intercepts associated with a bit line operation for each of the plurality of temperature ranges, or according to another embodiment, the plurality of coefficients and the plurality of intercepts may be a plurality of word line coefficients and a plurality of word line intercepts associated with an operation on a stored word line in each of the plurality of temperature ranges.

The coefficients and intercepts output in each embodiment may be stored (e.g., pre-stored) values by inferring in advance the trend line as in the right graph of FIGS. 4A and 4B through machine learning.

FIG. 6 is a diagram for explaining a three-dimensional V-NAND structure applicable to a nonvolatile memory device according to some example embodiments. The memory cell array 110 illustrated in FIG. 2 may include a plurality of memory blocks, and each of the plurality of memory blocks may be represented by an equivalent circuit as illustrated in FIG. 6.

The memory block BLKi shown in FIG. 6 represents a three-dimensional memory block formed on a substrate in a three-dimensional structure. For example, a plurality of memory NAND strings included in the memory block BLKi may be formed in a direction perpendicular to the substrate.

Referring to FIG. 6, the memory block BLKi may include a plurality of memory NAND strings NS11 to NS33 connected between bit lines BL1, BL2, and BL3 and common source line CSL. Each of the plurality of memory NAND strings NS11 to NS33 may include a string select transistor SST, a plurality of memory cells MC1, MC2, . . . , and MC8, and a ground select transistor GST. Although it is illustrated in FIG. 6 that each of the plurality of memory NAND strings NS11 to NS33 includes eight memory cells MC1, MC2, . . . , and MC8, the present disclosure is not limited thereto.

The string select transistor SST may be connected to corresponding string select lines SSL1, SSL2, and SSL3. The plurality of memory cells MC1, MC2, . . . , and MC8 may be connected respectively to the corresponding gate lines GTL1, GTL2, . . . , and GTL8. The gate lines GTL1, GTL2, . . . , and GTL8 may correspond to word lines, and some of the gate lines GTL1, GTL2, . . . , and GTL8 may correspond to dummy word lines. The ground select transistor GST may be connected to the corresponding ground select lines GSL1, GSL2, and GSL3. The string select transistor SST may be connected to the corresponding bit lines BL1, BL2, and BL3, and the ground select transistor GST may be connected to the common source line CSL. The bit lines BL1, BL2, and BL3 may be connected respectively to the corresponding page buffer circuits PB1, PB2, and PB3. Each of the page buffer circuits PB1, PB2, and PB3 may be the page buffer circuit 140 of FIG. 2. The page buffer circuit will be described in detail with reference to FIGS. 7 to 9.

The word line (e.g., WL1) at the same height may be connected in common, and the ground select lines GSL1, GSL2, and GSL3 and the string select lines SSL1, SSL2, and SSL3 may be separated from each other. Although it is illustrated in FIG. 6 that the memory block BLK is connected to eight gate lines GTL1, GTL2, . . . , and GTL8 and three bit lines BL1, BL2, and BL3, but the present disclosure is not limited thereto.

Figure 7:
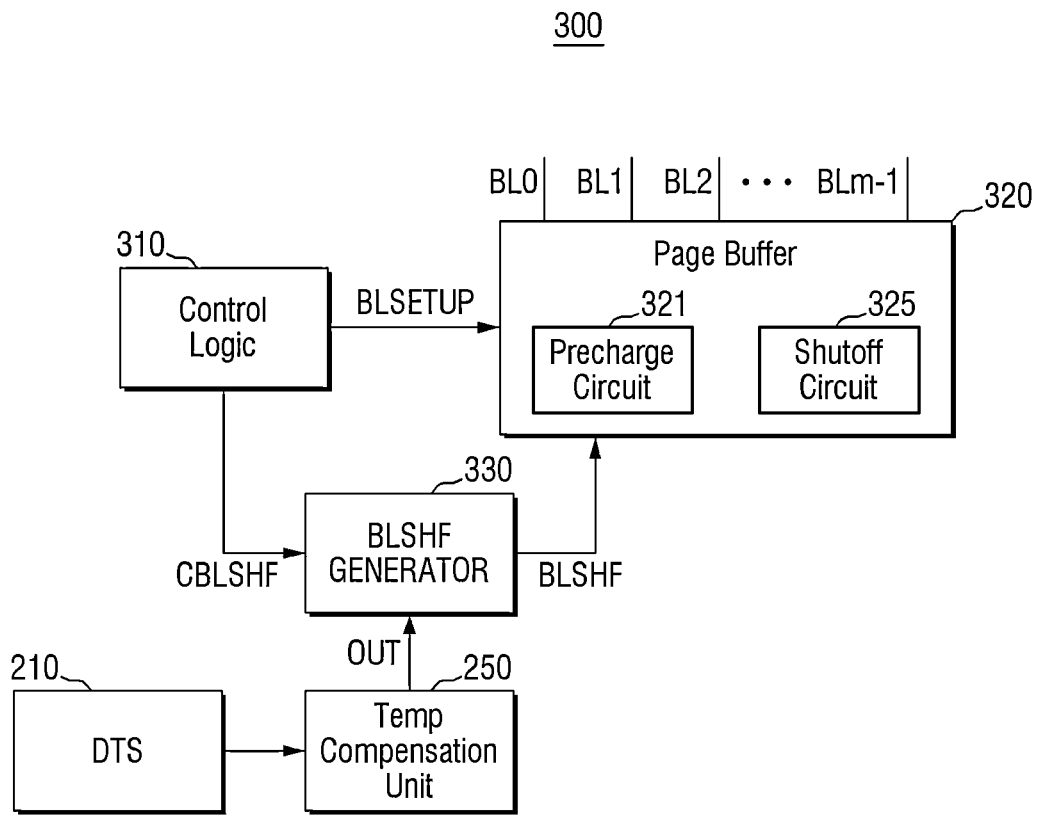
FIG. 7 is a block diagram illustrating in more detail an example of the page buffer circuit and the control logic of FIG. 2.

FIG. 7 is a block diagram illustrating in more detail an example of the page buffer circuit and control logic of FIG. 2. The page buffer circuit 320 may operate as a write driver and/or a sense amplifier depending on an operation mode. For example, during a write operation, the page buffer circuit 320 may transmit a bit line voltage that corresponds to data to be written to the bit lines BL0, . . . , and BLm−1 of the memory cell array 110. During a read operation, the page buffer circuit 320 may sense data stored in a selected memory cell through a bit line. The page buffer circuit 320 may latch the sensed data and output the latched data to the outside.

The page buffer circuit 320 may include a precharge circuit 321 and a shutoff circuit 325. The precharge circuit 321 may include at least one transistor controlled by a bit line setup signal BLSETUP, and the shutoff circuit 325 may include at least one transistor controlled by a bit line shutoff signal BLSHF.

A control logic 310 may output various control signals for controlling the page buffer circuit 320 and the address decoder 120 to perform a read operation in response to the command CMD. For example, the control logic 310 may transmit the bit line setup signal BLSETUP to the precharge circuit 321.

The control logic 310 may output a shutoff signal control signal CBLSHF to the bit line shutoff signal generator 330 for controlling a bit line shutoff signal generator 330. The control logic 310 may control the bit line shutoff signal generator 300 to change the bit line shutoff signal BLSHF from a first level (e.g., a precharge voltage V_PRE) to a second level (e.g., a development voltage V_DEV). In these cases, the temperature compensation unit 250 may adjust a power supply voltage that generates the bit line shutoff signal BLSHF on the basis of the temperature code TEMP code measured in real-time and output by the digital temperature sensor 210 for the nonvolatile memory device 100. For example, the temperature compensation unit 250 may generate a power supply voltage OUT of a transistor circuit that generates the bit line shutoff signal BLSHF of the bit line shutoff signal generator 330. For example, when the nonvolatile memory device 100 operates at a first temperature range (e.g., hot temperature), the bit line shutoff signal BLSHF generates a first bit line shutoff signal BLSHF1 based on a first power supply voltage OUT1. For example, when the nonvolatile memory device 100 operates at a second temperature range (e.g., cold temperature), the bit line shutoff signal BLSHF generates a second bit line shutoff signal BLSHF2 based on a second power supply voltage OUT2. In these cases, the first bit line shutoff signal BLSHF1 at a hot temperature may be adjusted to a logic high level voltage lower than the second bit line shutoff signal BLSHF2 at a cold temperature. For example, assuming that a logic high level voltage of an unadjusted bit line shutoff signal is 2 V, the logic high level voltage of the first bit line shutoff signal BLSHF1 may be adjusted to 1.2 V and the logic high level voltage of the second bit line shutoff signal BLSHF2 may be adjusted to 1.4 V.

The address decoder 120 may select one of the memory blocks of the memory cell array 110 in response to the address ADDR. The address decoder 120 may select one of word lines of the selected memory block. The address decoder 120 may transmit a word line voltage from the voltage generator to the selected word line WL of the memory block BLKi.

The bit line shutoff signal generator 330 may generate the bit line shutoff signal BLSHF based on the shutoff signal control signal CBLSHF received from the control logic 310 and output the generated signal to the page buffer circuit 320. The bit line shutoff signal BLSHF may have a voltage level irrespective of a deviation of the power supply voltage provided to the nonvolatile memory device 100 from the outside. The bit line shutoff signal BLSHF may be provided to the shutoff circuit 325 of the page buffer circuit 320. The bit line shutoff signal generator 330 may determine a voltage level of the bit line voltage control signal BLSHF according to the voltages supplied from the voltage generator under the control of the temperature unit 200 and output the determined voltage level.

Figure 8:
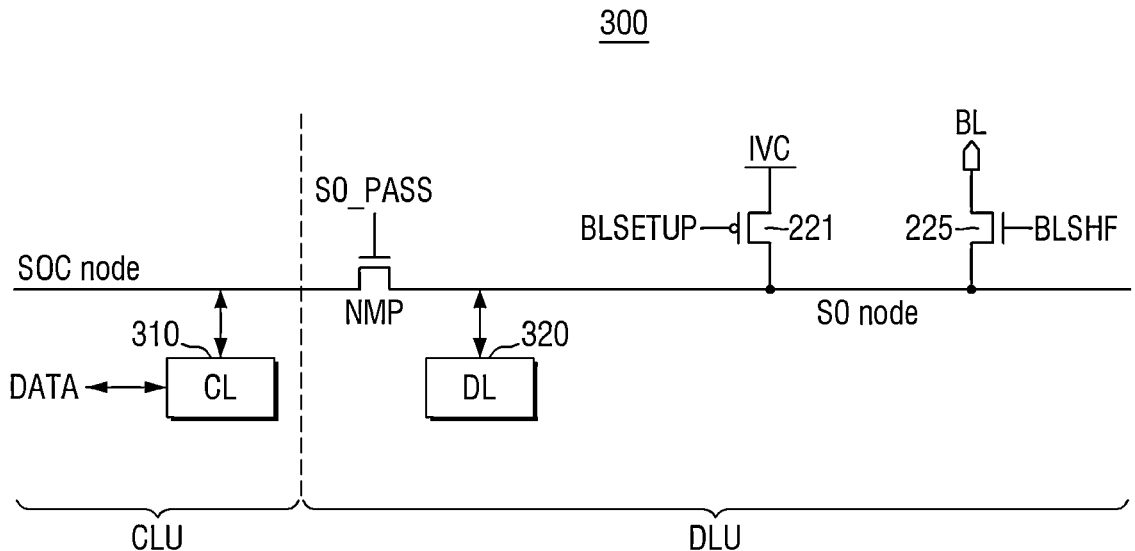
FIG. 8 is a diagram illustrating one page buffer circuit included in a page buffer circuit of FIG. 3.
Figure 9:
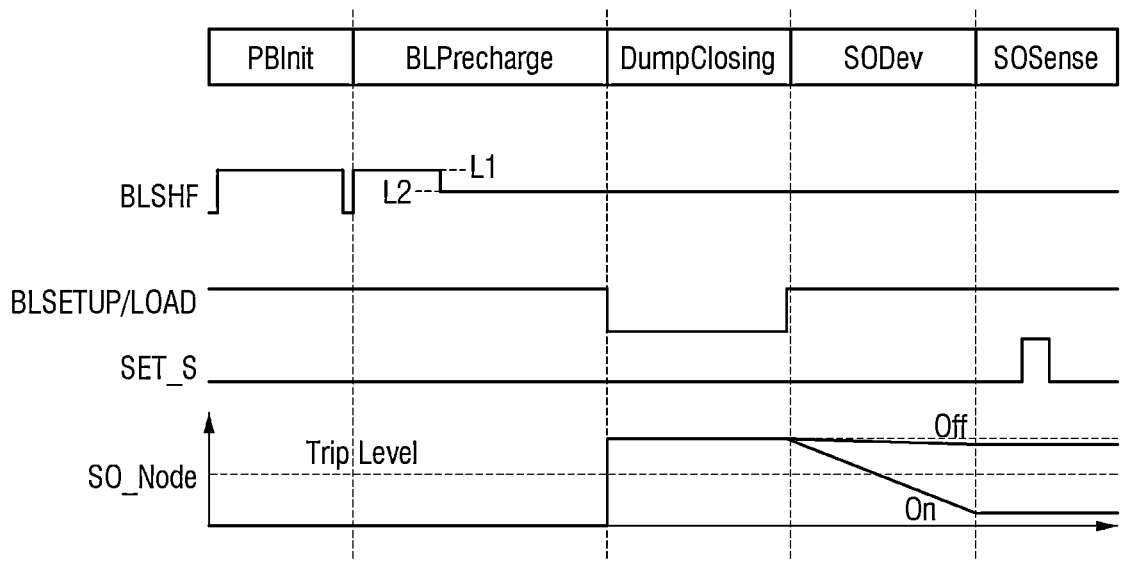
FIG. 9 is a timing diagram of an operation of a data latch node in the page buffer circuit of FIG. 8.

FIG. 8 is a diagram illustrating one page buffer circuit PB included in the page buffer circuit of FIG. 3, and FIG. 9 is a timing diagram of an operation of a data latch node SO node in the page buffer circuit PB of FIG. 8.

Referring to FIG. 8, a page buffer circuit PBa 300 may include a cache latch unit CLU and a data latch unit DLU. The cache latch unit CLU may include a cache latch 310. For example, the cache latch 310 may store data DATA to be stored in a memory cell. Also, the cache latch 310 may store data DATA transmitted from a data latch 320. The cache latch 310 may be connected to a cache latch node SOC. The cache latch 310 may transmit and receive data DATA through the cache latch node SOC. The cache latch unit CLU may include, for example, two or more cache latches.

The cache latch node SOC may be connected to a data latch node SO node through a pass transistor NMP. The pass transistor NMP may be turned on or off according to a pass signal SO_PASS. When the pass transistor NMP is turned on, the data DATA may be transmitted between the cache latch 310 and the data latch 320.

The data latch unit DLU may include a data cache. For example, the data cache may store data DATA transmitted from the cache latch 310. Also, the data cache may store data DATA read from a memory cell. The data latch 320 may be connected to the data latch node SO node. The data latch 320 may transmit and receive data DATA through the data latch node SO node. The data latch unit DLU may include, for example, two or more data latches.

The data latch node SO node may be precharged during a read, write, and/or erase operation of the nonvolatile memory device 100. For example, the data latch node SO node may be precharged according to the internal supply voltage IVC through a setup transistor 221. The setup transistor 221 may be turned on or off according to the bit line setup signal BLSETUP. The setup transistor 221 may be a P-type transistor. However, the type of the setup transistor 221 is not limited thereto. For example, the data latch node SO node may be connected to a bit line BL through a shutoff transistor 225. The shutoff transistor 225 may be turned on or off according to the bit line shutoff signal BLSHF. The shutoff transistor 225 may gradually decrease the voltage of the data latch node SO node from the precharge voltage to the off level according to the voltage level of the bit line shutoff signal BLSHF and the state of the selected memory cell. The shutoff transistor 225 may be an N-type transistor. However, the type of the shutoff transistor 225 is not limited thereto.

Referring to FIGS. 8 and 9, the page buffer circuit PB is initialized (PBInit). While the page buffer circuit PB performs an initialization operation, the temperature sensor 210 senses the temperature of the memory cell array in real time. At this time, the bit line shutoff signal BLSHF has a logic high level and then transitions to a logic low level after initialization is completed, and the bit line setup signal BLSETUP maintains a logic high level during the initialization operation. In these cases, the bit line shutoff signal BLSHF may maintain a voltage level (e.g., 2 V), which is generated according to a preset power supply voltage, during the initialization operation PBInit. A set signal SET_S for moving the data of the memory cell to the data latch maintains a logic low level.

The data latch node SO node may be precharged according to an internal supply voltage IVC in a precharge operation period BLPrecharge. Also, in the precharge operation period BLPrecharge, the bit line setup signal BLSETUP may be at a logic high level, and the bit line shutoff signal BLSHF may be adjusted to a logic high level adjusted based on the measured temperature. For example, the logic high level of the bit line shutoff signal BLSHF may be adjusted from an L1 level to an L2 level according to the temperature state of the memory cell array. The L2 level is a value equal to or less than the L1 level or a value greater than the logic low level. For example, the L1 level may be a voltage level (2 V) generated during the initialization operation, and the L2 level may be a logic high level adjusted to be smaller than the L1 level by means of temperature compensation. For example, at a hot temperature, the L2 level may be adjusted to approximately 1.2 V, and at a cold temperature, the L2 level may be adjusted to approximately 1.4 V. The setup transistor 221 may be turned off as the bit line setup signal BLSETUP has a logic high level, and the shutoff transistor 225 may be turned on according to bit line shutdown signal BLSHF of the adjusted logic high level. In these cases, the bit line BL may also be precharged together with the data latch node SO node.

The bit line setup signal BLSETUP may be changed to a logic low level in a dump closing period Dump Closing, and changed back to a logic high level in a development period SODev. Accordingly, the setup transistor 221 is turned off. In addition, during the development period SODev, the bit line shutoff signal BLSHF is continuously maintained at the logic high level adjusted by temperature compensation, the shutoff transistor 225 is turned on, and the voltage level of the data latch node SO node decreases according to the state of the selected memory cell. When a voltage lower than a threshold voltage of the selected memory cell is applied to the selected word line WL (when the selected memory cell is an on cell), the data latch node SO node maintains the initial voltage level intact or the voltage level will drop very slightly. When a voltage higher than the threshold voltage of the selected memory cell is applied to the selected word line WL (when the selected memory cell is an off cell), the voltage level of the data latch node SO node will drop gradually.

When the sensing set signal SET_S is activated in a sensing period SOSense, the changed voltage level of the changed data latch node SO node is sensed and amplified in the page buffer and the relevant data is stored in the data latch 320. Accordingly, the nonvolatile memory device 100 may detect the state of the selected memory cell by comparing the voltage level of the data latch node SO node after a specific time with a set reference value Trip level.

In these cases, when the selected memory cell is an off cell, a voltage drop rate of the data latch node SO node varies according to temperature. In general, the voltage drop rate of the data latch node SO node reduces at a cold temperature. Therefore, if the same bit line development time BL Develop Time is applied regardless of the temperature, the probability of an operation error increases. When the selected memory cell is an on cell, the effect of temperature is relatively small because the voltage level of the data latch node SO only needs to be greater than a reference value A. The temperature unit 200 may adjust the voltage level of the bit line shutoff signal BLSHF to reduce an operation error when sensing the voltage level at the data latch node SO node. By adjusting the L1 level to the L2 level according to the temperature change, the amount of charge precharged in a data sensing node is adjusted. In this way, even when the operating temperature of the memory cell array 110 changes linearly or non-linearly, the data latch node SO node may have a constant voltage drop rate by adjusting the amount of precharged charge according to the temperature.

Figure 10:
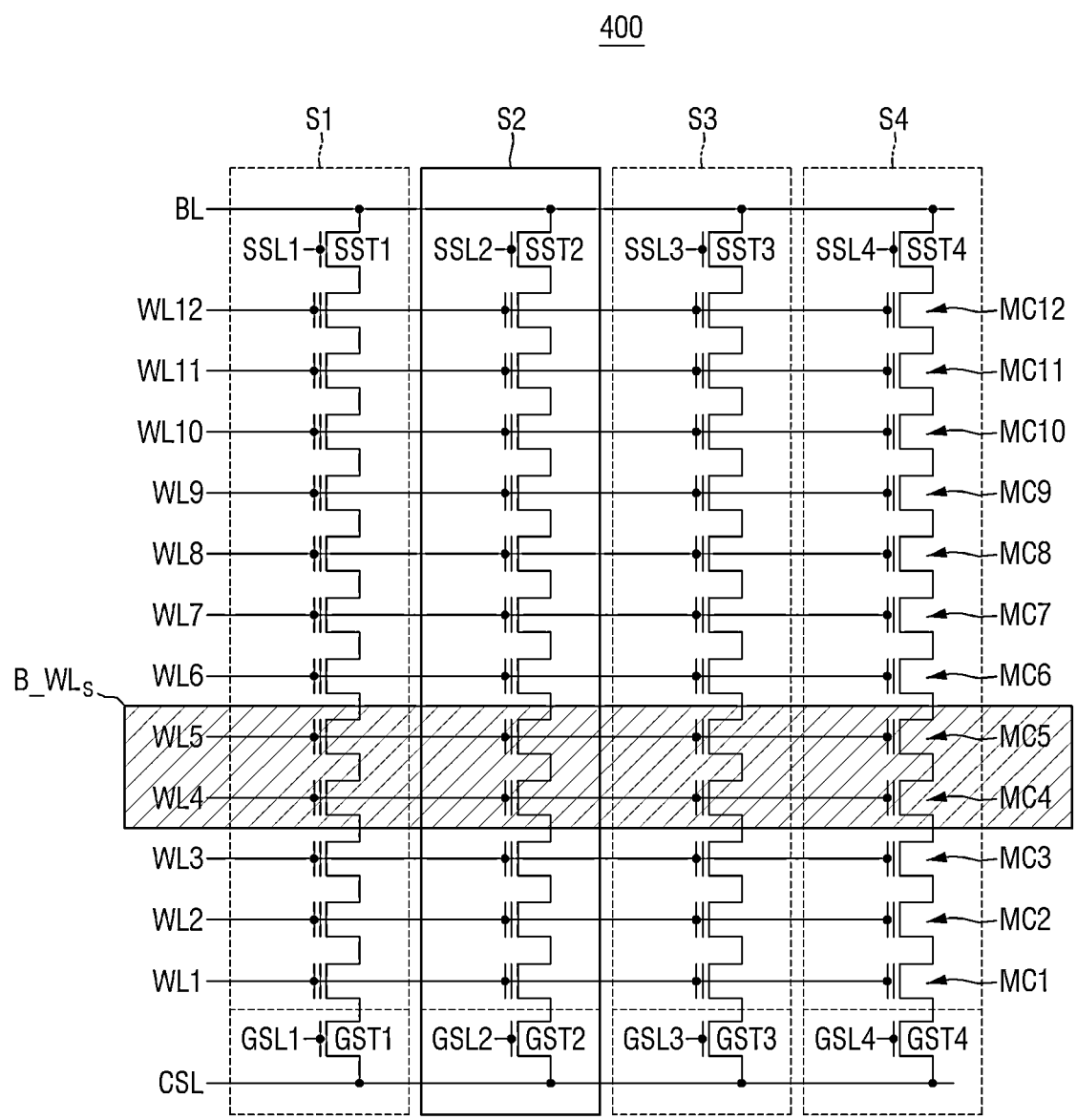
FIGS. 10 to 12 are diagrams for explaining an operation of a memory device according to some example embodiments.
Figures 11, 12:
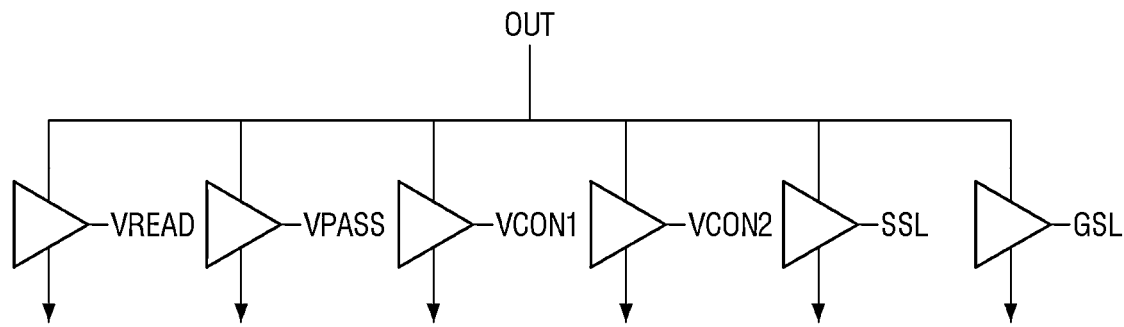

FIGS. 10 to 12 are diagrams for explaining an operation of a memory device according to some example embodiments.

Referring to FIG. 10 first, a memory cell array 400 includes a plurality (e.g., first to fourth) cell strings S1 to S4, and each of the plurality of (e.g., the first to fourth cell strings S1 to S4) cell strings may include a plurality of memory cells MC1 to MC12 e.g., connected between the string select lines SSL1 to SSL4 and the ground select lines GSL1 to GSL4. The memory cell array of FIG. 10 may be a part of the memory cell array described with reference to FIGS. 2 and 6. Although it is illustrated in FIG. 10 that each of four cell strings S1 to S4 includes twelve memory cells MC1 to MC12, the present disclosure is not limited thereto.

The nonvolatile memory device 100 may select, as a barrier line B_WLs, at least one of a plurality of unselected word lines WL1 to WL11 connected to a second cell string S2 that is a selected cell string. A channel of each of unselected cell strings S1, S3, and S4 may be logically divided into a plurality of channels in at least a partial period of a read operation by the barrier line B_WLs.

The nonvolatile memory device 100 may determine a boosting level of a channel included in each of the unselected cell strings S1, S3, and S4 based on a read voltage input to a twelfth word line WL12 that is a selected word line. For example, the memory device may determine that a voltage level having a predetermined (and/or otherwise determined) voltage difference from the read voltage is a boosting level of a channel included in each of the unselected cell strings S1, S3, and S4. The nonvolatile memory device may select at least one of the plurality of unselected word lines WL1 to WL11 as a barrier line B_WLs based on the determined boosting level of the channel of each of the unselected cell strings S1, S3, and S4. For example, in the embodiment illustrated in FIG. 10, fourth and fifth word lines WL4 and WL5 may be selected as the barrier lines B_WLs.

The nonvolatile memory device 100 may input a turn-on voltage to a selected string selection line SSL2 and a selected ground select line GSL2. The memory device may input a turn-off voltage, for example, a ground voltage, to the barrier lines B_WLs during a first period. Also, the memory device may input a turn-on voltage, for example, the same voltage as a read pass voltage, to the barrier lines B_WLs during a second period. The memory device may selectively input a pre-pulse voltage to the unselected string select lines SSL2 to SSL4 or the unselected ground select lines GSL2-GSL4 during the first period.

Referring to FIG. 11, the channels of the unselected string selection lines SSL2 to SSL4 may be electrically divided into a plurality of channels by the barrier lines B_WLs during the first period. Potential of some of the plurality of channels electrically divided by a selectively input pre-pulse voltage may increase to a predetermined boosting level. Thereafter, during the second period, as a read pass voltage is input to the barrier lines B_WLs, the plurality of electrically divided channels may be electrically connected again. The boosting level of the electrically connected channels may be determined according to a boosting level of each of the channels divided by the barrier lines B_WLs, the ratio of the number of word lines corresponding to each of the divided channels, and the like.

Next, referring to FIG. 11, a predetermined turn-on voltage (denoted as on) may be input to the second string select line SSL2 that is a selected string select line Sel_SSL and a second ground select line GSL2 that is a selected ground select line Sel_GSL.

A turn-off voltage, for example, a ground voltage, may be input to each of the first, third, and fourth string select lines SSL1, SSL3, and SSL4 that are unselected string select lines Unsel_SSLs. In addition, a pre-pulse voltage may be input to the first, third, and fourth ground select lines GSL1, GSL3, and GSL4 that are unselected ground select lines Unsel_GSLs.

A read pass voltage $V_{PASS}$ may be input to the first to third word lines WL1 to WL3 and the sixth to eleventh word lines WL6 to WL11 that are unselected word lines Unsel_WLs. In addition, a turn-off voltage, for example, a ground voltage, may be input to the fourth and fifth word lines WL4 and WL5, selected as the barrier lines B_WLs, during the first period, and a read pass voltage $V_{PASS}$ may be input to the fourth and fifth word lines WL4 and WL5 during the second period.

In addition, voltages input to the third and sixth word lines WL3 and WL6 that are the word lines BN1_WLs closest to the barrier lines B_WLs may be less than the read pass voltage $V_{PASS}$ in at least a portion of the first period and the second period. Further, voltages input to the second and seventh word lines WL2 and WL7 that are the unselected word lines BN2_WLs second closest to the barrier lines B_WLs may also be less than the read pass voltage $V_{PASS}$ in the sensing period.

In the sensing period during which the read voltage is input to the selected word lines WL4 and WL5 connected to the selected memory cell from data is to be read, a potential of the channel located above the barrier lines with respect to the selected word lines, e.g., the barrier lines, may be adjusted to suppress hot carrier injection or soft erase, thereby improving data reliability.

For example, referring to FIG. 12, the nonvolatile memory device 100 may use temperature-compensated power supply voltage OUT as a power supply voltage required to generate at least one of the respective operating voltages described with reference to FIGS. 10 and 11, for example, at least one of the read voltage $V_{READ}$ required to read data stored in the memory cell, the read pass voltage $V_{PASS}$, the control voltages $V_{CON1}$ to $V_{CON2}$, the string select line (SSL) voltage, or the ground select line (GSL) voltage.

For example, the temperature-compensated power supply voltage OUT may be the output signal described with reference to FIG. 3.

Figure 13:
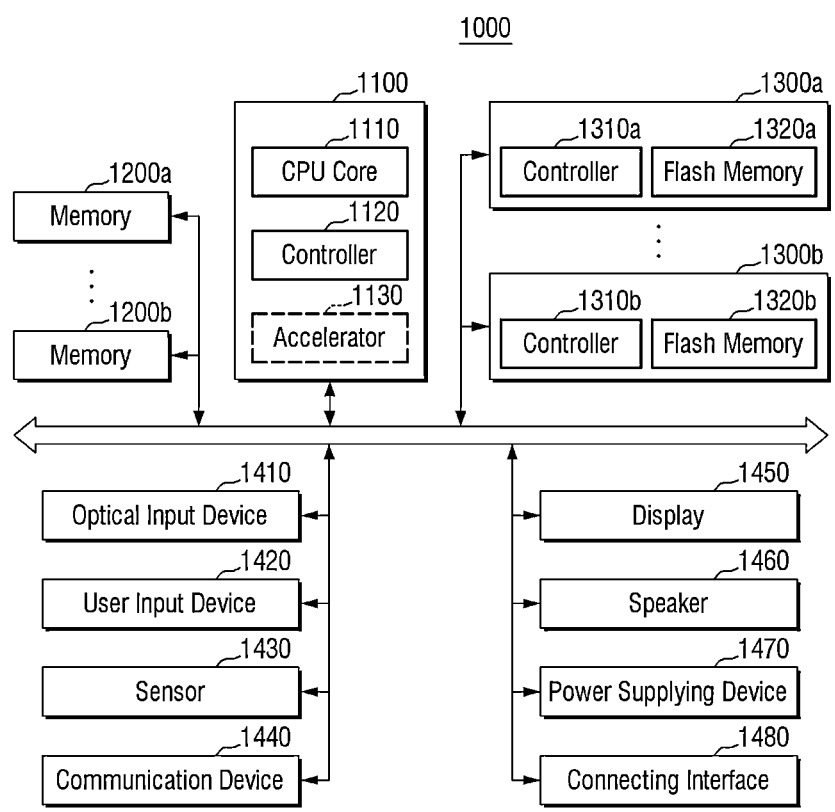
FIG. 13 is a diagram illustrating a system to which a memory system in accordance with some example embodiments is applied.

FIG. 13 is a diagram illustrating a system to which a memory system in accordance with some example embodiments is applied.

A system 1000 of FIG. 13 may be basically a mobile system, such as a mobile phone, a smartphone, a tablet personal computer (PC), a wearable device, a healthcare device, and/or an Internet-of-Things (IoT) device. However, the system 1000 is not necessarily limited to a mobile system, and may be a personal computer, a laptop computer, a server, a media player, automotive equipment, such as a navigation system, and/or the like.

Referring to FIG. 13, the system 1000 may include a main processor 1100, memories 1200a and 1200b, and storage devices 1300a and 1300b, and may additionally include one or more of an image capturing device 1410, a user input device 1420, a sensor 1430, a communication device 1440, a display 1450, a speaker 1460, a power supplying device 1470, and a connecting interface 1480.

The main processor 1100 may control the overall operation of the system 1000, more specifically, the operation of other components constituting the system 1000. The main processor 1100 may be implemented as a general-purpose processor, a dedicated processor, an application processor, and/or the like.

The main processor 1100 may include one or more CPU cores 1110, and may further include a controller 1120 configured to control the memories 1200a and 1200b and/or the storage devices 1300a and 1300b. According to some example embodiment, the main processor 1100 may further include an accelerator block 1130 that is a dedicated circuit for high-speed data operation, such as artificial intelligence (AI) data operation. The accelerator block 1130 may include a graphics processing unit (GPU), a neural processing unit (NPU), a data processing unit (DPU), and/or the like, and may be implemented using a separate chip physically independent from other components of the main processor 1100.

The memories 1200a and 1200b may be used as main memory devices of the system 1000 and may each include a nonvolatile memory such as an SRAM and/or a DRAM but may include a nonvolatile memory such as a flash memory, a PRAM, and/or a RRAM. The memories 1200a and 1200b may be implemented within the same package as the main processor 1100.

The storage devices 1300a and 1300b may function as nonvolatile storage devices that store data irrespective of whether power is supplied or not, and may have a relatively larger storage capacity than the memories 1200a and 1200b. The storage devices 1300a and 1300b may include storage controllers 1310a and 1310b, respectively, and nonvolatile memory (NVM) storages 1320a and 1320b storing data under the control of the storage controllers 1310a and 1310b, respectively. The nonvolatile memories 1320a and 1320b may include a V-NAND flash memory in a two-dimensional structure or a three-dimensional structure, but may include other types of nonvolatile memory, such as a PRAM and/or a RRAM. The storage devices 1300a and 1300b may be memory systems according to some embodiments described with reference to FIGS. 1 to 12.

The storage devices 1300a and 1300b may be included in the system 1000 while being physically separated from the main processor 1100, or may be implemented within the same package as the main processor 1100. In addition, the storage devices 1300a and 1300b may be of a type, such as a solid-state device (SSD) or a memory card, and thus may be detachably coupled with other components of the system 1000 through an interface, such as the connecting interface 1480 which will be described below. The storage devices 1300a and 1300b may each be a device to which a standard rule is applied, such as universal flash storage (UFS), embedded multi-media card (eMMC), and/or nonvolatile memory express (NVMe), but the present disclosure is not limited thereto.

The image capturing device 1410 may capture a still image or a moving picture, and may be, e.g., a camera, a camcorder, a webcam, and/or the like.

The user input device 1420 may receive various types of data input by a user of the system 1000, and may be, e.g., a touch pad, a keypad, a keyboard, a mouse, a microphone, and/or the like.

The sensor 1430 may sense various types of physical quantities detected from the outside of the system 1000 and convert the sensed physical quantities into electrical signals. The sensor 2430 may be, e.g., a temperature sensor, a pressure sensor, an illuminance sensor, a position sensor, an acceleration sensor, a biosensor, a gyroscope, and/or the like.

The communication device 1440 may transmit and receive signals to and from other devices outside the system 1000 according to various communication protocols. The communication device 1440 may be implemented by including an antenna, a transceiver, a MODEM, and/or the like.

The display 1450 and the speaker 1460 may function as output devices that output visual information and auditory information to the user of the system 1000, respectively.

The power supplying device 1470 may convert power supplied from a power source (such as a battery) (not shown) built into the system 1000 and/or an external power source and supply the converted power to each component of the system 1000.

The connecting interface 1480 may provide a connection between the system 1000 and an external device that is connected to the system 1000 and capable of exchanging data with the system 1000.

Figure 14:
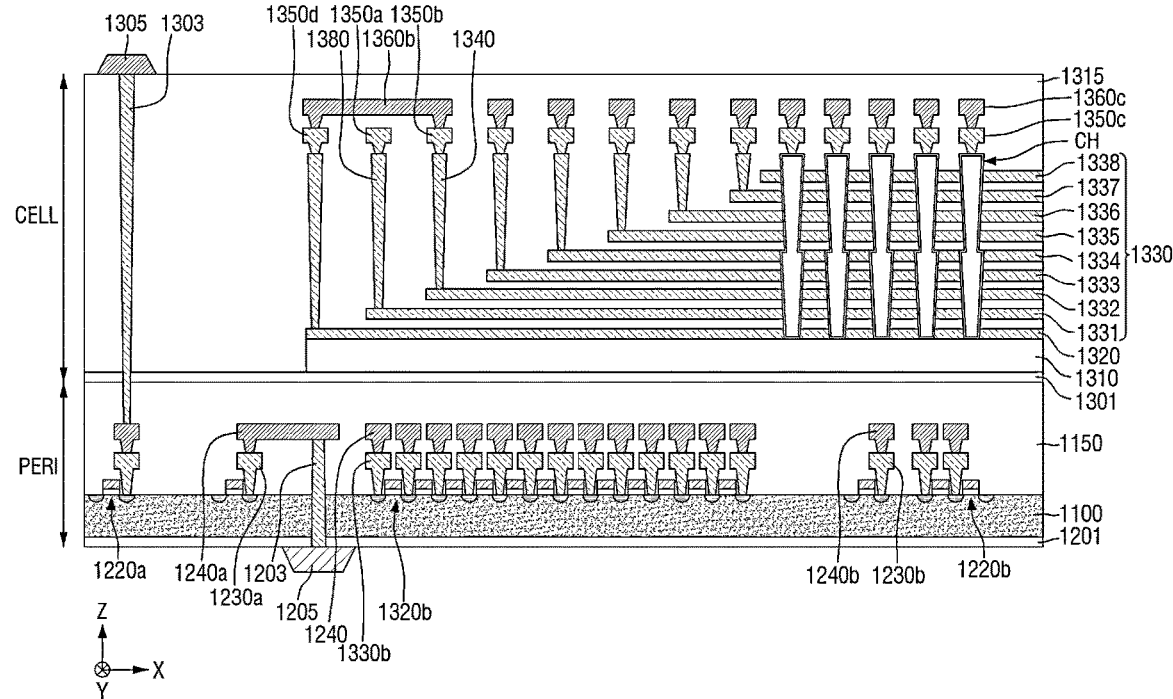
FIGS. 14 and 15 are cross-sectional views of a nonvolatile memory device according to some embodiments.
Figure 15:
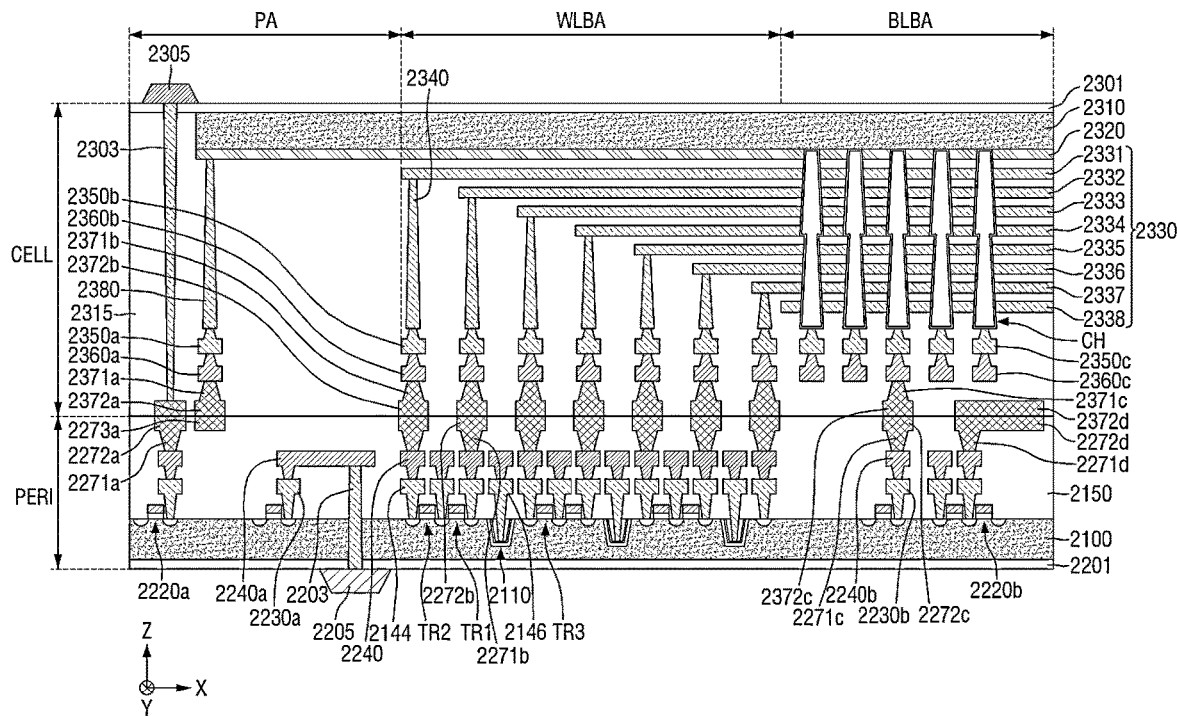

FIGS. 14 and 15 are cross-sectional views of a nonvolatile memory device according to some example embodiments.

A memory device 1000 of FIG. 14 and a memory device 2000 of FIG. 15 may have a chip to chip (C2C) structure. The C2C structure may be a structure in which a first chip, including a cell area CELL, is fabricated on a first wafer, a second chip, including a peripheral circuit area PERI, is fabricated on a second wafer, different from the first wafer, and then, the first second chip are connected to each other via bonding.

According to some embodiments, the bonding may refer to a method of electrically connecting a bonding metal formed on a topmost metal layer of an upper chip and a bonding metal formed on a topmost metal layer of a lower chip to each other. For example, the bonding metal may be at least one of copper (Cu), aluminum (Al), and/or tungsten (W), and/or the bonding may be Cu—Cu bonding.

Each of the peripheral circuit area PERI and the cell area CELL of the memory devices 1000 and 2000 may include an external pad bonding area PA, a word line bonding area WLBA, and a bit line bonding area BLBA.

The peripheral circuit area PERI of FIG. 14 may include a first substrate 1201, an interlayer insulating layer 1100, a plurality of circuit devices 1220a, 1220b and 1220c formed on the first substrate 1201, first metal layers 1230a, 1230b and 1230c connected to the plurality of circuit devices 1220a, 1220b and 1220c, respectively, and second metal layers 1240a, 1240b and 1240c formed on the first metal layers 1230a, 1230b and 1230c, respectively. The peripheral circuit area PERI of FIG. 15 may include a first substrate 2201, an interlayer insulating layer 2100, a plurality of circuit devices 2220a, 2220b and 2220c formed on the first substrate 2201, first metal layers 2230a, 2230b and 2230c connected to the plurality of circuit devices 2220a, 2220b and 2220c, respectively, and second metal layers 2240a, 2240b and 2240c formed on the first metal layers 2230a, 2230b and 2230c, respectively. In some embodiments, the first metal layers 1230a, 1230b, 1230c, 2230a, 2230b, and/or 2230c may be formed of tungsten having relatively high resistance and/or the second metal layers 1240a, 1240b, 1240c, 2240a, 2240b, and/or 2240c may be formed of copper having relatively low resistance.

For brevity, only the first metal layers 1230a, 1230b, and 1230c, or 2230a, 2230b, and 2230c, and the second metal layers 1240a, 1240b, and 1240c, or 2240a, 2240b, and 2240c, are illustrated and described, but the example embodiments thereof are not limited thereto. For example, at least one metal layer may be further formed on the second metal layers. The at least one metal layer formed on the second metal layers 1240a, 1240b, and 1240c, or 2240a, 2240b, and 2240c, may be formed of aluminum that has lower resistance than that of copper forming the second metal layers.

The interlayer insulating layer 1100 or 2100 may be disposed on the first substrate 1201 or 2201 to cover the plurality of circuit devices 220a, 1220b, and 1220c, or 2220a, 2220b, and 2220c, the first metal layers 1230a, 1230b, and 1230c, or 2230a, 2230b, and 2230c, and the second metal layers 1240a, 1240b, and 1240c, or 2240a, 2240b, and 2240c. The interlayer insulating layer 1100 or 2100 may include an insulating material such as silicon oxide, silicon nitride, and/or the like.

Lower bonding metals 1127b and 1272b, or 2271b and 2272b, may be formed on the second metal layer 1240b or 2240b of the word line bonding area WLBA. In the word line bonding area WLBA, the lower bonding metals 1127b and 1272b, or 2271b and 2272b, of the peripheral circuit area PERI may be electrically connected to upper bonding metals 1371b and 1372b, or 2371b and 2372b, of the cell area CELL via bonding. The lower bonding metals 1127b and 1272b, or 2271b and 2272b, and the upper bonding metals 1371b and 1372b, or 2371b and 2372b, may be formed of aluminum (Al), copper (Cu), tungsten (W), and/or the like.

The cell area CELL may provide at least one memory block. The cell area CELL may include the second substrate 1301 or 2301 and a common source line 1320 or 2320. On the second substrate 1301 or 2301, a plurality of word lines (1331 to 1338; collectively word lines 1330 in FIG. 14, or 2331 to 2338; collectively word lines 2330 in FIG. 15) may be stacked in a direction (e.g., Z direction) perpendicular to an upper surface of the second substrate 1301 or 2301. String select lines and a ground select line may be disposed above and below the word lines 1330 or 2330, respectively. The plurality of word lines 1330 or 2330 may be disposed between the string select lines and the ground select line.

In the bit line bonding area BLBA, a channel structure CH may extend in the direction (e.g., the Z direction) perpendicular to the upper surface of the second substrate 1330 or 2330 to penetrate through the word lines, the string select lines, and the ground select line. The channel structure CH may include a data storage layer, a channel layer, an embedded insulating layer, and the like, and the channel layer may be electrically connected to a first meal layer 1350c or 2350c and a second metal layer 1360c or 2360c. For example, the first metal layer 1350c or 2350c may be a bit line contact, and the second metal layer 1360c or 2360c may be a bit line. In some embodiments, the bit line 1360c or 2360c may extend in a first direction (Y direction) parallel to the upper surface of the second substrate 1301 or 2301.

In the example embodiments illustrated in FIGS. 14 and 15, an area in which the channel structure CH, the bit line 1360c or 2360c and the like are disposed may be referred to as the bit line bonding area BLBA. In the bit line bonding area BLBA, the bit line 1360c or 2360c may be electrically connected to the circuit devices 1220c or 2220c that provides a page buffer circuit 1393 or 2393 in the peripheral circuit area PERI. For example, the bit line 1360c or 2360c may be connected to upper bonding metals 1371c and 1372c, or 2371c and 2372c, in the peripheral circuit area PERI, the upper bonding metals 1371c and 1372c, or 2371c and 2372c, may be connected to lower bonding metals 1271c and 1272c, or 2271c and 2272c connected to the circuit devices 1220c or 2220c of the page buffer circuit 1393 or 2393.

In the word line bonding area WLBA, the word lines 1330 or 2330 may extend in a second direction (e.g., X direction) parallel to the upper surface or a lower surface of the second substrate 1301 or 2301 and may be connected to a plurality of cell contact plugs 1340 or 2340. The word lines 1330 or 2330 and the cell contact plugs 1340 or 2340 may be connected to each other on pads provided by at least some word lines 1330 or 2330 extending in the second direction. A first metal layer 1350b or 2350b and a second metal layer 1360b or 2360b may be sequentially connected above or below the cell contact plugs 1340 or 2340 connected to the word lines 1330 or 2330. The cell contact plugs 1340 or 2340 may be connected to the peripheral circuit area PERI by upper bonding metals 1371b and 1372b, or 2371b and 2372b, of the cell area CELL and bonding metals 1271b and 1272b, or 2271b and 2272b, of the peripheral circuit area PERI in the word line bonding area WLBA.

In the peripheral circuit area PERI, the cell contact plugs 1340 or 2340 may be electrically connected to the circuit devices 1220b or 2220b that provides a row decoder 394. In some embodiments, operating voltages of the circuit devices 1220b or 2220b providing a row address decoder may be different from operating voltages of the circuit devices 1220c or 2220c providing the page buffer circuit. For example, the operating voltages of the circuit devices 1220c or 220c providing the page buffer circuit may be greater than the operating voltages of the circuit devices 1220b or 2220b providing the row decoder.

A common source line contact plug 1380 or 2380 may be disposed in an external pad bonding area PA. The common source line contact plug 1380 or 2380 may be formed of a conductive material, such as a metal, a metal compound, polysilicon, or the like, and may be connected to a common source line 1320 or 2320. A first metal layer 1350a or 2350a and a second metal layer 1360a or 2360a may be sequentially stacked on the common source line contact plug 1380 or 2380. For example, an area in which the common source line contact plug 1380 or 2380, the first metal layer 1350a or 2350b, and the second metal layer 1360a or 2360a are disposed may be defined as the external pad bonding area PA.

Input/output pads 1205 and 1350, or 2205 and 2305, may be disposed in the external pad bonding area PA. Referring to FIGS. 14 and 15, a lower insulating layer 1100 or 2100 that covers a lower surface of the first substrate 1201 or 2201 may be formed on a lower portion of the first substrate 1201 or 2201, and a first input/output pad 1205 or 2205 may be formed on the lower insulating layer 1100 or 2100. The first input/output pad 1205 or 2205 may be connected to at least one of the plurality of circuit devices 1220a, 1220b, and 1220c, or 2220a, 2220b, and 2220c, disposed in the peripheral circuit area PERI via the first input/output contact plug 1203 or 2203, and may be separated from the first substrate 1201 or 2201 by the lower insulating layer 201. In addition, a side insulating layer may be disposed between the first input/output contact plug 1203 or 2203 and the first substrate 1201 or 2201 to electrically disconnect the first input/output contact plug 1203 or 2203 from the first substrate 1201 or 2201.

An upper insulating layer 1310 or 2310 that covers the upper surface of the second substrate 1301 or 2301 may be formed on the second substrate 1301 or 2301, and a second input/output pad 1305 or 2305 may be disposed on the upper insulating layer 1310 or 2310. The second input/output pad 1305 or 2305 may be connected to at least one of the plurality of circuit devices 1220a, 1220b, and 1220c, or 2220a, 2220b, and 2220c, disposed in the peripheral circuit area PERI via the second input/output contact plug 1303 or 2303.

According to some example embodiments, the plurality of circuit devices may include the peripheral circuits described with reference to FIGS. 2 to 12. For example, the temperature unit 200, the address decoder 120, the control logic and voltage generator 130, the page buffer 140, and the input/output circuit 150 may be included on the second substrate. According to some embodiments, the temperature sensor 210 in the temperature unit 200 may be disposed on a lower portion (FIG. 14) or on an upper portion (FIG. 15) of the cell area and may measure a real-time temperature state of the memory cell array.

According to some embodiments, the second substrate 1301 or 2301 and the common source line 1320 or 2320 may not be disposed in the region where the second input/output contact plug 1303 or 2303 is disposed. Also, the second input/output pads 1305 or 2305 may not overlap the word lines 1380 or 2380 in a third direction (Z-axis direction). The second input/output contact plug 2302 of FIG. 15 may be separated from the second substrate 2301 in a direction parallel to the upper surface of the second substrate 2301, and may be connected to a contact plug 2272a on the first substrate 2201, passing through the interlayer insulating layer 2315 of the cell area CELL.

According to some example embodiments, the first input/output pad 1205 or 2205 and the second input/output pad 1305 or 2305 may be selectively formed. For example, the memory device 1000 of FIG. 14 may include only the first input/output pad 1205 disposed below the first substrate 1201, or may include only the second input/output pad 1305 disposed above the interlayer insulating layer 1315. Alternatively, the memory device 1000 may include both the first input/output pad 1205 and the second input/output pad 1305. In another example, the memory device 2000 of FIG. 15 may include only the first input/output pad 2205 disposed below the first substrate 2201, or may include only the second input/output pad 2305 disposed above the second substrate 2301. Selectively, the memory device 2000 may include both the first input/output pad 2205 and the second input/output pad 2305.

In the external pad bonding area PA and the bit line bonding area BLBA included in each of the cell area CELL and the peripheral circuit area PERI, a metal pattern of a topmost metal layer may exist as a dummy pattern, or the topmost metal layer may be empty.

In the external pad bonding area PA, the memory device 2000 of FIG. 15 may form a lower metal pattern 2273a on the topmost metal layer of the peripheral circuit area PERI in correspondence with an upper metal pattern 2372a formed on the topmost metal layer of the cell area CELL, the lower metal pattern 2273a having the same shape as the upper metal pattern 2372a of the cell area CELL. The lower metal pattern 2273a formed in the topmost metal layer of the peripheral circuit area PERI is not connected to a separate contact in the peripheral circuit area PERI. Similarly, in the external pad bonding area PA, the memory device 2000 may form an upper metal pattern on the topmost metal layer of the cell area CELL in correspondence with a lower metal pattern formed on the topmost metal layer of the peripheral circuit area PERI, the upper metal pattern having the same shape as the lower metal pattern of the peripheral circuit area PERI.

The lower bonding metals 2271b and 2272b may be formed on the second metal layer 2240 of the word line bonding area WLBA of FIG. 15. In the word line bonding area WLBA, the lower bonding metals 1271b and 2272b of the peripheral circuit area PERI may be electrically connected to the upper bonding metals 2371b and 2372b of the cell area CELL via bonding.

In addition, in the bit line bonding area BLBA of FIG. 15, the memory device 2000 may form an upper metal pattern 2392 on the topmost metal layer of the cell area CELL in correspondence with a lower metal pattern 2252 formed on the topmost metal layer of the peripheral circuit area PERI, the upper metal pattern 2392 having the same shape as the lower metal pattern 2252 of the peripheral circuit area PERI. No contact may be formed on the upper metal pattern 2392 formed on the topmost metal layer of the cell area CELL.

Example embodiments of the present disclosure have been described hereinabove with reference to the accompanying drawings, but the present disclosure is not limited to the above-described example embodiments, and may be implemented in various different forms, and one of ordinary skill in the art to which the present disclosure pertains may understand that the present disclosure may be implemented in other specific forms without changing the technical spirit or essential features of the present disclosure. Therefore, it is to be understood that the example embodiments described above are illustrative rather than being restrictive in all aspects.

The invention claimed is:

1. A nonvolatile memory device comprising:
a memory cell array including a plurality of memory cells;
an address decoder configured to decode a row address and a column address from an address signal;
a first voltage generator configured to generate a word line operating voltage for each word line of the memory cell array according to the decoded row address;
a second voltage generator configured to generate a bit line operating voltage of the memory cell array according to the decoded column address;
a page buffer circuit configured to activate according to the bit line operating voltage and to store data to be stored in or read from at least one memory cell; and
a temperature unit configured to determine, from a temperature range table storing a plurality of selection signals mapped to each of a plurality of temperature ranges, a temperature range for a temperature code according to a real-time temperature of the memory cell array, and to adjust a power supply voltage of at least one of the first or second voltage generator based on a selection signal mapped to the determined temperature range,
wherein the temperature unit includes a digital temperature sensor configured to measure a temperature state of the nonvolatile memory device in real time and to output the measured temperature state as the temperature code, and
wherein the power supply voltage is linearly adjusted for each of the plurality of temperature ranges such that the adjustments are represented by a corresponding coefficient, of a plurality of coefficients, and a corresponding intercept, of a plurality of intercepts, for each of the plurality of temperature ranges and such that the adjustments change between temperature ranges,
the plurality of coefficients respectively corresponding to the plurality of selections signals,
the corresponding coefficient selected based on the selection signal mapped to the determined temperature range,
the plurality of intercepts respectively corresponding to the plurality of selection signals, and
the corresponding intercept selected based on the selection signal mapped to the determined temperature range.

2. The nonvolatile memory device of claim 1, wherein the temperature unit includes:
a coefficient selector configured to output the corresponding coefficient based on the selection signal mapped to the determined temperature range; and
an intercept selector configured to output the corresponding intercept based on the selection signal mapped to the determined temperature range.

3. The nonvolatile memory device of claim 2, wherein the temperature unit further includes:
a multiplier configured to multiply the temperature code by the output coefficient;
an adder configured to add the selected intercept to an output from the multiplier;
a multiplexer configured to output an output of the adder when the digital temperature sensor is activated;
a comparator configured to output a current compensation level by comparing a previous compensation level with a current reference voltage to which a resistance value corresponding to an output signal of the adder is applied; and
a temperature compensation transistor configured to be gated according to the current compensation level and to generate the adjusted power supply voltage.

4. The nonvolatile memory device of claim 1, wherein the page buffer circuit includes:
a precharge circuit comprising at least one transistor controlled by a bit line setup signal output from a control circuit; and
a shutoff circuit comprising at least one transistor controlled by a bit line shutoff signal,
wherein the second voltage generator includes a bit line shutoff signal generator configured to adjust a voltage level of the bit line shutoff signal according to an output of the temperature unit.

5. The nonvolatile memory device of claim 4, wherein the bit line shutoff signal generator is configured to adjust the voltage level of the bit line shutoff signal according to a current compensation level determined based on the selection signal mapped to the determined temperature range.

6. The nonvolatile memory device of claim 1, wherein
the address decoder is configured to select at least one of a plurality of word lines according to the row address decoded from the address signal and to apply the word line operating voltage to each of the selected word line, and
the first voltage generator is configured to adjust a voltage level of the word line operating voltage according to a current power supply voltage level according to the selection signal mapped to the determined temperature range.

7. The nonvolatile memory device of claim 2, wherein the plurality of coefficients and the plurality of intercepts include:
a plurality of bit line coefficients respectively associated with a bit line operation for each of the plurality of temperature ranges;
a plurality of bit line intercepts respectively associated with the bit line operation for each of the plurality of temperature ranges;
a plurality of word line coefficients respectively associated with a word line operation for each of the plurality of temperature ranges; and
a plurality of word line intercepts respectively associated with the word line operation for each of the plurality of temperature ranges.

8. A nonvolatile memory device comprising:
a cell region comprising a memory cell array comprising a plurality of memory cells on a first substrate; and
a peripheral circuit region on a second substrate including a plurality of circuit elements and a temperature unit, the plurality of circuit elements configured to access the memory cell array and the temperature unit configured to sense a real-time temperature of the memory cell array and to determine a temperature range, from among a plurality of temperature ranges, for the sensed real-time temperature and to adjust an operating voltage to be applied to the memory cell array based on a compensation value mapped to the determined temperature range,
wherein the temperature unit includes a digital temperature sensor configured to measure a temperature state of the nonvolatile memory device in real time and to output the measured temperature state as a temperature code, and
wherein the operating voltage is linearly adjusted for each of the plurality of temperature ranges such that the adjustments are represented by a corresponding coefficient, of a plurality of coefficients, and a corresponding intercept, of a plurality of intercepts, for each of the plurality of temperature ranges and such that the adjustments change between each of the plurality of temperature ranges,
the plurality of coefficients respectively corresponding to a plurality of compensation values,
the corresponding coefficient selected based on the compensation value mapped to the determined temperature range,
the plurality of intercepts respectively corresponding to the plurality of compensation values, and
the corresponding intercept selected based on the compensation value mapped to the determined temperature range.

9. The nonvolatile memory device of claim 8, wherein the plurality of circuit elements include:
an address decoder configured to decode a row address and a column address from an address signal;
a first voltage generator configured to generate a word line operating voltage for the memory cell array according to the decoded row address;
a second voltage generator configured to generate a bit line operating voltage according to the decoded column address; and
a page buffer circuit configured to activate according to the bit line operating voltage and to store data to be stored in or read from at least one memory cell.

10. The nonvolatile memory device of claim 9, wherein the page buffer circuit includes:
a precharge circuit comprising at least one transistor controlled by a bit line setup signal output from a control circuit; and
a shutoff circuit including at least one transistor controlled by a bit line shutoff signal,
wherein the second voltage generator is configured to adjust a voltage level of the bit line shutoff signal by adjusting a power supply voltage according to the compensation value.

11. The nonvolatile memory device of claim 9, wherein
the address decoder is configured to select at least one of a plurality of word lines according to the decoded row address and to apply the word line operating voltage to the selected word line, and
the first voltage generator is configured to adjust a voltage level of the word line operating voltage by adjusting a power supply voltage according to the compensation value.

12. The nonvolatile memory device of claim 9, wherein the temperature unit further includes:
a coefficient selector configured to output the corresponding coefficients based on the selection signal mapped to the determined temperature range; and
an intercept selector and configured to output the corresponding intercepts based on the selection signal mapped to the determined temperature range.

13. The nonvolatile memory device of claim 12, wherein the plurality of coefficients include, respectively, a plurality of bit line coefficients and a plurality of word line coefficients that, respectively, correspond to the plurality of temperature ranges.

14. The nonvolatile memory device of claim 12, wherein the plurality of intercepts include, respectively, a plurality of bit line intercepts and a plurality of word line intercepts that, respectively, correspond to the plurality of temperature ranges.

15. The nonvolatile memory device of claim 8, wherein the temperature unit includes:
a temperature range table configured to output the corresponding coefficient and the corresponding intercept for the temperature range which corresponds to the temperature code.

16. The nonvolatile memory device of claim 8, wherein the second substrate is below or above the first substrate.

17. A nonvolatile memory device comprising:
a memory cell array comprising a plurality of memory cells;
a digital temperature sensor below the memory cell array and configured to measure a real-time temperature of the memory cell array and to output a temperature code according to the real-time temperature;
a first address decoder and voltage generator connected to at least one word line of the memory cell array and configured to apply a word line operating voltage to the at least one word line according to a decoded word line address;

a second address decoder and voltage generator connected to at least one bit line of the memory cell array and configured to apply a bit line operating voltage to the at least one bit line according to a decoded bit line address;

a plurality of page buffer circuits connected to the at least one bit line of the memory cell array and configured to transmit data to a memory cell that corresponds to the decoded word line address and the decode bit line address and/or to receive stored data; and a temperature unit configured to control at least one of the word line operating voltage or the bit line operating voltage such that at least one of a voltage level of the word line operating voltage or a voltage level of the bit line operating voltage is linearly adjusted based on a compensation value selected according to a temperature range, from among a plurality of temperature ranges, for the temperature code, wherein the adjustments are represented by a corresponding coefficient, of a plurality of coefficients, and a corresponding intercept, of a plurality of intercepts, for each of the plurality of temperature ranges and such that the adjustments change between each of the plurality of temperature ranges, the plurality of coefficients respectively corresponding a plurality of compensations values, the corresponding coefficient selected based on the selection signal mapped to the temperature range, the plurality of intercepts respectively corresponding to the plurality of compensation values, and the corresponding intercept selected based on the selection signal mapped to the temperature range.

18. The nonvolatile memory device of claim 17, wherein the temperature unit includes:

a temperature range table configured to output the correspond coefficients and the corresponding intercepts respectively mapped to the plurality of temperature ranges, for the temperature range which corresponds to the temperature code;

a multiplier configured to multiply the temperature code by the output coefficient;

an adder configured to add the selected intercept to an output from the multiplier;

a multiplexer configured to output an output of the adder when the digital temperature sensor is activated; and a comparator configured to output a current compensation level by comparing a previous compensation level with a current reference voltage to which a resistance value corresponding to an output signal of the adder is applied.

19. The nonvolatile memory device of claim 18, wherein the temperature range table is configured to store a plurality of bit line coefficients and a plurality of bit line intercepts associated with a bit line operation for each of the plurality of temperature ranges and to output a bit line coefficient and a bit line intercepts of the temperature range that corresponds to the temperature code, and the first address decoder and voltage generator are configured to adjust the voltage level of the bit line operating voltage by adjusting a power supply voltage according to the current compensation level that is generated based on the output bit line coefficient and the output bit line intercept.

20. The nonvolatile memory device of claim 19, wherein the page buffer circuit includes:

a precharge circuit comprising at least one transistor controlled by a bit line setup signal output from a control circuit; and a shutoff circuit comprising at least one transistor controlled by a bit line shutoff signal, and wherein the first address decoder and voltage generator are configured to adjust the voltage level of the bit line shutoff signal based on the current compensation level.

* * * * *